US 8,890,289 B2

(12) United States Patent
Manabe et al.

(10) Patent No.: US 8,890,289 B2
(45) Date of Patent: Nov. 18, 2014

(54) SEMICONDUCTOR DEVICE AND MANUFACTURING METHOD THEREFOR

(75) Inventors: Kenzo Manabe, Kanagawa (JP); Naoya Inoue, Kanagawa (JP); Kenichiro Hijioka, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 176 days.

(21) Appl. No.: 13/358,133

(22) Filed: Jan. 25, 2012

(65) Prior Publication Data
US 2012/0193760 A1 Aug. 2, 2012

(30) Foreign Application Priority Data

Jan. 28, 2011 (JP) ................................ 2011-017238

(51) Int. Cl.
*H01L 29/02* (2006.01)
*H01L 21/02* (2006.01)
*H01L 27/108* (2006.01)
*H01L 49/02* (2006.01)
*H01L 23/532* (2006.01)

(52) U.S. Cl.
CPC ..... *H01L 27/10894* (2013.01); *H01L 23/53295* (2013.01); *H01L 27/10814* (2013.01); *H01L 27/10852* (2013.01); *H01L 28/91* (2013.01); *H01L 23/5329* (2013.01); *H01L 23/53238* (2013.01)
USPC ............ 257/532; 257/E29.002; 257/E21.008; 438/381

(58) Field of Classification Search
CPC ................ H01L 2924/00; H01L 2924/00014; H01L 2224/05647; H01L 2224/32225; H01L 2224/48227; H01L 2224/73265; H01L 27/10852; H01L 27/10814; H01L 27/11502; H01L 27/11507
USPC ........................................ 257/306
See application file for complete search history.

(56) References Cited

U.S. PATENT DOCUMENTS 6,617,205 B1 9/2003 Kimura et al.
6,624,020 B2 9/2003 Mori
(Continued)

FOREIGN PATENT DOCUMENTS

JP 2002-313954 A 10/2002
JP 2003-163283 A 6/2003
JP 2004-342787 A 12/2004
JP 2005-26641 A 1/2005
(Continued)

OTHER PUBLICATIONS

M Ueki et al., High Performance Cu Interconnects with Damage-Less Full Mulecular-Pore-Stack (MPS) SiOCH for 32nm-node LSIs and Beyond, IEEE, 2008, pp. 619-622.

*Primary Examiner* — David Vu
*Assistant Examiner* — Jonathan Han
(74) *Attorney, Agent, or Firm* — Foley & Lardner LLP

(57) ABSTRACT

A semiconductor device includes: a multilayer wiring layer located over a substrate and in which multiple wiring layers configured by a wiring and an insulating layer are stacked; a memory circuit which is formed in a memory circuit region in the substrate and has a capacitance element embedded in a concave part located in the multilayer wiring layer; a logic circuit which is formed in a logic circuit region in the substrate; an upper part coupling wiring which is stacked over the capacitance element configured by a lower part electrode, a capacitor insulating film and an upper part electrode; and a cap layer which is formed on the upper surface of the wiring configuring the logic circuit. The upper surface of the upper part coupling wiring and the upper surface of the cap film are provided on the same plane.

10 Claims, 30 Drawing Sheets

(56) References Cited

U.S. PATENT DOCUMENTS

| | | |
|---|---|---|
| 6,710,389 B2 | 3/2004 | Shibata |
| 6,737,696 B1 * | 5/2004 | DeBoer et al. ............... 257/306 |
| 7,157,369 B2 | 1/2007 | Sugimura |
| 7,659,567 B2 * | 2/2010 | Aoki ........................... 257/306 |
| 8,258,039 B2 | 9/2012 | Inoue |

FOREIGN PATENT DOCUMENTS

| | | |
|---|---|---|
| JP | 2007-67451 A | 3/2007 |
| JP | 2007-201101 A | 8/2007 |
| JP | 2011-14731 A | 1/2011 |
| WO | WO 97/19468 A1 | 5/1997 |

* cited by examiner

SEMICONDUCTOR DEVICE AND MANUFACTURING METHOD THEREFOR

CROSS-REFERENCE TO RELATED APPLICATIONS

The disclosure of Japanese Patent Application No. 2011-17238 filed on Jan. 28, 2011 includes the specification, drawings and abstract is incorporated herein by reference in its entirety.

BACKGROUND

The present invention relates to a semiconductor device and a manufacturing method therefor.

Requirement of further high integration and high speed has been increased in manufacturing technology in a field of integrated circuits of the electronics industry. In addition, scale of the circuit has become large and difficulty in its design has been increased because of progress of integration.

An integration circuit mounting a logic circuit and a memory circuit over the same semiconductor substrate, what is called a circuit mounted in a mixed manner has following characteristics. Integration can be increased because the logic circuit and the memory circuit exist over the same substrate. Not only that, but also increase in operation speed is also possible because wiring between the circuits becomes short.

However, when a memory circuit including a capacitance element and a logic circuit are mounted over the same semiconductor substrate, a structure that is not used when a common logic circuit is formed is required to be used in order to form the capacitance element used for storage of data that the memory circuit has. For example, in a trench type capacitance element, a method in which a deep groove having a depth of several microns in the semiconductor substrate is formed and a capacitance element is formed therein is reported. However, a diameter of a trench opening becomes small with more microscopic formation of the element. Not only that, but also the depth becomes deeper and deeper in order to secure the capacity. Difficulty in manufacturing process of the trench type capacitance element is significantly increased.

On the other hand, in a stack type capacitance element, a fin type and a cylinder type stack structure are employed in order to realize desired capacity. What is called a COB structure (a Capacitor Over Bit line structure) is a structure in which a capacitance element is formed over a bit line. In the COB structure, height of the capacitor is set high in order to gain a capacity of the capacitance element. For example, in FIG. 22 of Patent Document 1, a stack type capacitance element which is formed in the same layer as a contact insulating layer is described as a related art. In this stack type structure, to gain height of a capacitance element 430 means that distance between a wiring of a lower part of the capacitance element and wiring of an upper part of the capacitance element becomes far. Thereby, in a logic circuit part, a contact 420b located in the same layer as the capacitance element from a first wiring layer to a diffusion layer also becomes high. In the manufacturing process, difficulty of the manufacturing process is increased. Not only that, but also parasitic resistance and parasitic capacity are increased.

When the memory circuit and the logic circuit are formed over the same semiconductor substrate, design which considers increased parasitic resistance and parasitic capacity of the contact caused by forming the capacitance element should be done, when the logic circuit is designed. This means that, even when the same logic circuit is designed, design parameters may be required be changed whether the capacitance element exists over the same semiconductor substrate or not. Despite the completely same circuit, the design should be done again because the circuit and the capacitance element are formed at the same time. Not only that, but also by mounting the capacitance element in a mixed manner, the circuits may decrease its operation speed, may not be operated due to decrease in its operating margin, or may increase its power consumption. For example, in FIG. 22 of Patent Document 1, when height of the capacitance element 430 is set high in order to increase capacity, height of the contact 420b also becomes high at the same time. As a result, operation speed of the logic circuit is contrarily decreased in the logic circuit.

Patent Document 1 describes a structure of a semiconductor device in which the height of the contact 420b of the logic circuit part is decreased. In Patent Document 1, in a related art, a capacitor plate and an interlayer insulating film and a capacitor contact are stacked in this order from the capacitance element to an upper part capacitor wiring. However, in an integrated circuit device 100 of the embodiment, the upper part capacitor wiring 122a is directly stacked over the upper surface of the capacitance element 130. Consequently, in the integrated circuit device 100 of the embodiment, a thickness between the upper surface and the lower surface of a logic contact 119 becomes thin by a thickness between the upper surface and the lower surface of the sum of the capacitor plate, the interlayer insulating film and a capacitor contact of the related art. Accordingly, it is described that, in the integrated circuit device 100 of the embodiment, an aspect ratio of the logic contact 119 can be decreased, and a thickness between the upper surface and the lower surface of the capacitance element 130 can be secured at the same time (FIG. 11).

In Patent Document 2, a capacitance element is embedded in a memory circuit part. On the other hand, in a logic circuit part located in the same layer as the capacitance element, a first layer wiring 200 is formed between a contact plug 33 and an upper part wiring film 202. Patent Document 2 describes that the height of the logic contact in the logic circuit part can be decreased compared with the related art by forming this first layer wiring 200 in an intermediate part of the capacitance element 44 (FIG. 7).

[Patent Document 1]
Japanese Unexamined Patent Application Publication No. 2007-201101
[Patent Document 2]
Japanese Unexamined Patent Application Publication No. 2004-342787
[Patent Document 3]
International Publication No. WO 97/19468 Pamphlet
[Patent Document 4]
Japanese Unexamined Patent Application Publication No. 2007-67451
[Non-patent Document 1]
International Electron Device Meeting Digest of Technical Papers IEEE, pp. 619-622, 2008

SUMMARY

As a result of an investigation conducted by the inventors of the present invention, the inventors have found that, in a capacitance element of the related art, there remains room for increasing its capacity value.

According to one aspect of the present invention, a semiconductor device includes: a substrate; a multilayer wiring layer which is located over the substrate and in which multiple wiring layers configured by a wiring and an insulating layer are stacked; a memory circuit which is formed in a memory circuit region in the substrate and has at least one capacitance element and a peripheral circuit embedded in a concave part located in the multilayer wiring layer in a plan view; a logic circuit which is formed in a logic circuit region in the substrate being different region from the memory circuit region in a plan view; an upper part coupling wiring which is stacked over the capacitance element configured by a lower part electrode, a capacitor insulating film and an upper part electrode in the concave part; and a cap layer which is located so as to contact to the upper surface of the wiring configuring the logic circuit located in a top layer among the wiring layers in which the capacitance element is embedded; in which the upper surface of the upper part coupling wiring and the upper surface of the cap layer configure the same plane.

According to the configuration described above, since the upper surface of the upper part coupling wiring and the upper surface of the cap layer are located in the same plane, height of the concave part can be high by a thickness of a cap film compared with the related art. Consequently, height of the capacitance element embedded in the concave part can set high. Thereby, according to the aspect of the present invention, increase in capacity of the capacitance element compared with the related art can be realized.

According to another aspect of the present invention, a manufacturing method for a semiconductor device having a memory circuit and a logic circuit over a substrate, the method includes the steps of: forming an insulating layer over the substrate; forming a wiring groove in the insulating layer, and forming a metal film embedding the wiring groove; forming a cap film over the metal film after planarizing the metal film; forming a concave part by removing a part of the cap film and the insulating layer; embedding a lower part electrode, a capacitor insulating film and an upper part electrode in the concave part, and forming a metal film for an upper part coupling wiring in the concave part and over the cap film; and forming an upper part coupling wiring by selectively removing the metal film for the upper part coupling wiring over the cap film.

According to the aspects of the present invention, a semiconductor device and a manufacturing method therefor which realizes increase in capacity of the capacitance element compared with the related art are provided.

DETAILED DESCRIPTION

Hereinafter, embodiments of the present invention are described using the drawings. Here, a similar reference numeral is assigned to a similar configuration element, and description for the element is arbitrarily omitted in all drawings.

First Embodiment

Figure 1:
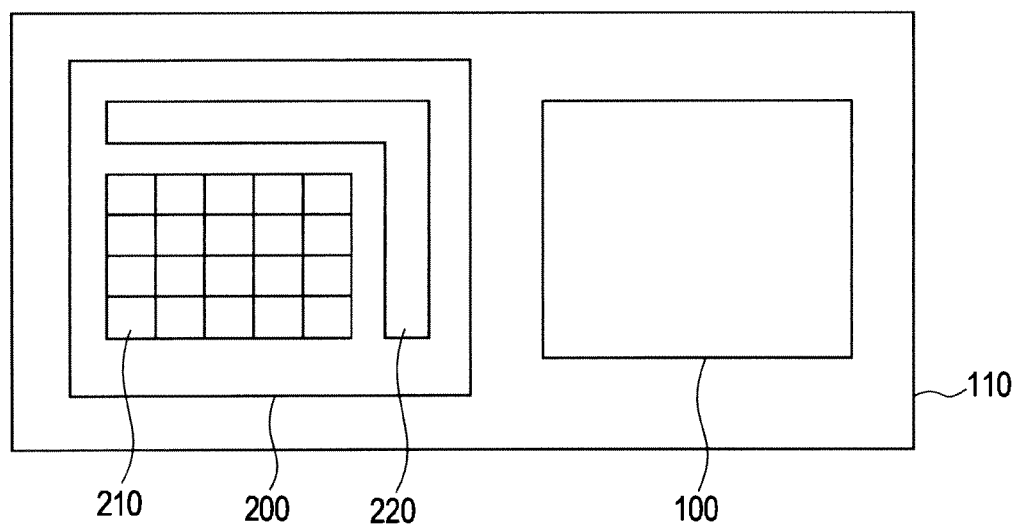
FIG. 1 is a top view schematically showing a semiconductor device in a first embodiment.
Figure 2:
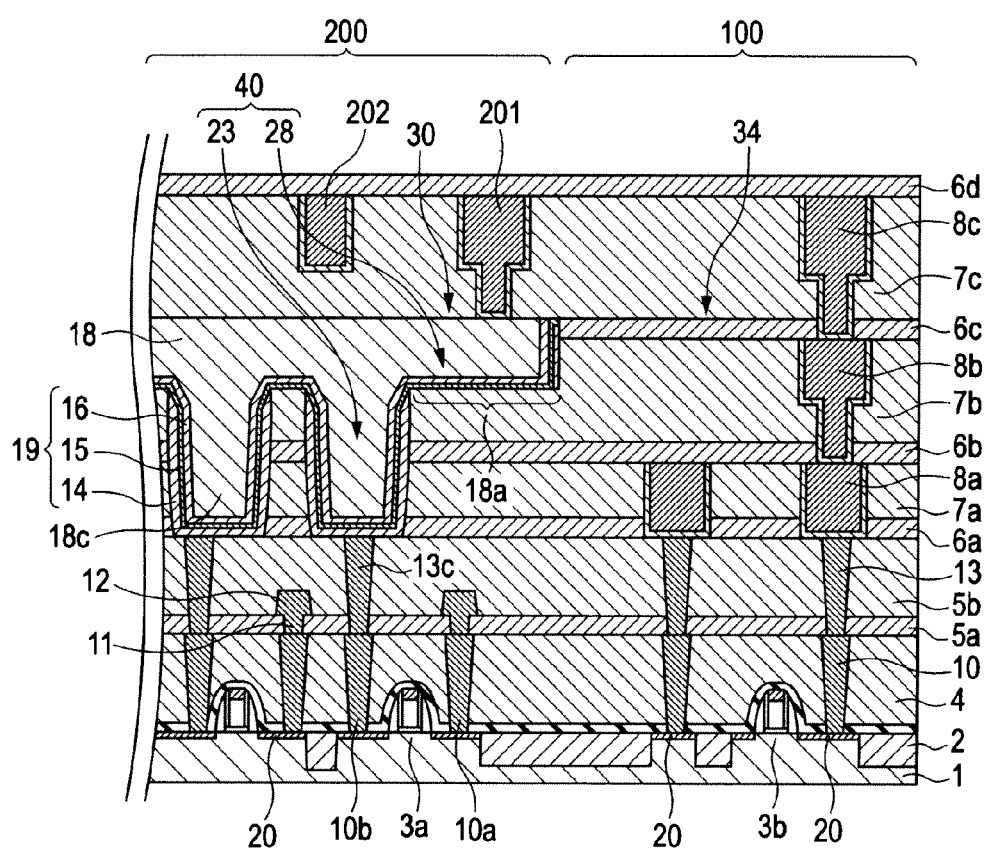
FIG. 2 is a cross-sectional view schematically showing the semiconductor device in the first embodiment.

A semiconductor device of a first embodiment is described. FIG. 1 is a top view schematically showing a semiconductor device in the first embodiment. FIG. 2 is a cross-sectional view schematically showing the semiconductor device in the first embodiment.

A semiconductor device of this embodiment includes a substrate (a semiconductor substrate 1); a multilayer wiring layer which is located over the semiconductor substrate 1 and in which multiple wiring layers configured by a wiring and an insulating layer are stacked; a memory circuit 200 which is formed in a memory circuit region in the semiconductor substrate 1 and has at least one capacitance element 19 and a peripheral circuit embedded in a concave part 40 located in the multilayer wiring layer in a plan view; a logic circuit 100 which is formed in a logic circuit region in the semiconductor substrate being different region from the memory circuit region 1 in a plan view; an upper part coupling wiring 18 which is stacked over the capacitance element 19 configured by a lower part electrode 14, a capacitor insulating film 15 and an upper part electrode 16 in the concave part 40; and a cap layer (a cap film 6c) which is located so as to contact to the upper surface of the wiring 8b configuring the logic circuit 100 located in a top layer (a interlayer insulating film 7b) among the wiring layers in which the capacitance element 19 is embedded. In this semiconductor device, the upper surface 30 of the upper part coupling wiring 18 and the upper surface 34 of the cap film 6c configure the same plane. In this embodiment, the same plane means a plane which preferably has a maximum value of height fluctuation of unevenness to an average height of the surface of 30 nm or less, more preferably 20 nm or less and further preferably 10 nm or less, when the maximum value is measured by the following measuring method. This kind of measuring method includes a method in which a cross-sectional image including the upper surface 30 of the upper part coupling wiring 18 and the upper surface 34 of the cap film 6c is obtained by using SEM (Scanning Electron Microscope) and TEM (Transmission Electron Microscope) and the height fluctuation of steps is measured from this cross-sectional image, and a method in which height profile in a planar direction is measured by a step meter which is widely used for an inspection process in manufacturing process of semiconductor devices.

As shown in FIG. 1, the semiconductor device of this embodiment has a configuration in which the memory circuit 200 including the capacitance element and the logic circuit 100 forming semiconductor elements are mounted in a mixed manner over the semiconductor substrate 110. The logic circuit 100 is not a peripheral circuit 220 of the capacitance element 210 in the memory circuit 200 but is formed in a different region from the memory circuit 200. For example, the logic circuit region can be determined as a region where a high speed logic circuit such as CPU (Central Processing Unit) is formed.

With reference to FIG. 2, each of the logic circuit 100 and the memory circuit 200 is formed over the semiconductor substrate 1. Here, configuration elements in the drawings of the logic circuit 100 and the memory circuit 200 just selectively show a part of elements configuring each circuit. Therefore, a range of rights of the present invention shall not be limited by active elements, and a coupling method of multilayer wiring and the like which do not directly relates to embodiments according to this embodiment.

As shown in FIG. 2, over the surface of the semiconductor substrate 1, each of an active element 3b which is formed in the logic circuit region and configures the logic circuit 100 and an active element 3a which is formed in the memory circuit region and configures memory cells of the memory circuit 200 is formed. In a spaced part between the active element 3a and the active element 3b, an element separation film 2 is formed over the surface of the semiconductor substrate 1. For the element separation film 2 (a silicon dioxide film and the like) and the active elements 3a and 3b (transistors and the like), products made by usually used manufacturing method for a semiconductor device may be used. The range of rights of the present invention shall not be limited by these structures and the materials.

In the actual memory circuit 200, a bit line 12 and a longitudinal direction of a gate of the active element 3a configuring the memory cells are arranged in a positional relation intersecting almost at right angles. However, for the purpose of simplification of the drawing, the longitudinal direction of the gate of the active element 3 is illustrated so that the longitudinal direction is extended in a vertical direction to the paper surface being the same as the bit line 12. With regard to the positional relation between the bit line 12 and the longitudinal direction of the gate of the active element 3 which configures the logic circuit 100, similar illustration method is used for the cross-sectional views of the present invention unless otherwise noted. Arrows indicate a surface or a hole or a wiring groove in the view.

Subsequently, structures and materials of members configuring the semiconductor device of the first embodiment are described in detail.

As shown in FIG. 2, contact interlayer insulating films 4, 5a and 5b are formed over the element separation film 2, the active element 3a (the first active element) and the active element 3b (the second active element) which are formed over the semiconductor substrate 1. In the contact interlayer insulating film 4 (a first contact insulating layer), a first cell contact (a cell contact 10a and a cell contact 10b) and a second cell contact (a cell contact 10) are embedded. On the other hand, in the contact interlayer insulating films 5a and 5b (a second contact insulating layer) formed over the contact interlayer insulating film 4, a bit contact 11, the bit line 12, a capacitor contact 13c and a coupling contact 13 are embedded respectively. The capacitor contact 13c electrically couples the active element 3a and the capacitance element 19. The coupling contact 13 electrically couples the active element 3b and a wiring 8a of the logic circuit 100. The cell contact 10a electrically couples the active element 3a and the bit contact 11. The cell contact 10b is formed between the semiconductor substrate 1 and the capacitor contact 13c and electrically couples the active element 3a and the capacitor contact 13c. The cell contact 10 is formed between the semiconductor substrate 1 and the coupling contact 13 and electrically couples the active element 3b and the coupling contact 13. The lower surface of the coupling contact 13 is directly contacted to the upper surface of the cell contact 10 (For example, when a barrier metal film is formed around the coupling contact 13, the barrier metal film located over the lower face of the coupling contact 13 contacts to the upper surface of the cell 10). The lower surface of the capacitor contact 13c directly contacts to the upper surface of the cell contact 10b. The term "contact" is defined in order to clarify each term in this specification of the present invention. Hereinafter, terms of each "contact" in this specification is pursuant to the above-described terms.

For at least one layer selected from the contact interlayer insulating films 4, 5a and 5b, a silicon dioxide film can be used. However, an insulating film having a lower specific inductive capacity than the silicon dioxide film is more preferable. As this kind of insulating film, for example, the following film may be used. The film includes an insulating film, which is generally referred to as a low dielectric constant film, substituting oxygen atoms in the silicon dioxide film to fluorine or carbon atoms and hydrocarbon groups, or what is called a porous film which has at least silicon, oxygen and carbon, and further has fine pores having a diameter of several nanometers or less in the insulating film. As a specific inductive capacity of these insulating films is preferably 3.1 or less when an insulating film has no fine pores in the film, and further preferably, the specific inductive capacity is preferably 2.6 or less when an insulating film has fine pores in the film. By such a structure, the parasitic capacity of the contact can be reduced. As a result, delay of the memory circuit and the logic circuit can be reduced and operation speed of the semiconductor elements can be increased.

In the memory circuit 200, one diffusion layer of the active element 3a and the bit line 12 are electrically coupled by the bit contact 11 and the cell contact 10a. The other diffusion layer of the active element 3a and the capacitance element 19 are electrically coupled by the cell contact 10b and the capacitor contact 13c. By this structure, the active element 3a, the bit line 12 and the capacitance element 19 are coupled each other. As a result, one transistor-one capacitor type memory cell, which is a common memory cell of DRAM (Dynamic Random Access Memory) circuit is configured.

Over the contact interlayer insulating film 5b, the cap films 6a, 6b, 6c and 6d and the interlayer insulating films 7a, 7b, 7c, and 7d are alternately and sequentially stacked. In a region of the logic circuit 100, each of wirings 8a, 8b and 8c is formed in each interlayer film. As described above, a multilayer wiring layer is formed in this embodiment. The wirings 8b and 8c are more preferably formed by the dual damascene method, which is usually used as a forming method of multilayer wiring of a semiconductor device. Thereby, manufacturing cost of the wiring can be reduced and via resistance generated by coupling between the wiring and a wiring exist in a different layer. In the wirings 8b and 8c shown in FIG. 2, reference numerals are assigned as wirings, which also include vias for coupling to each of the wirings 8a and 8b located in the lower layer. In other words, in this embodiment, a wiring formed by the damascene method include a via, unless otherwise stated. Around each wiring 8a-8c, barrier metal films are formed.

In this embodiment, as a metal wiring material can be selected from a metal material including Cu, W, Al and the like, or an alloy including these elements as a main component (for example, 95% by weight or more) or a metal material including these materials. All wirings configuring the logic circuit 100 may be configured by a metal material having a dual damascene structure and including Cu, or including Cu as a main component. Thereby, operation speed of the semiconductor device can be increased. On the other hand, as contact plug materials (the cell contact 10, the cell contact 10a, the cell contact 10b, the bit contact 11, the coupling contact 13, a capacitor contact 13c and the like), the same material as the metal wiring material can be used. Although the contact plug materials may be configured by the same material as the metal wiring or a different type of material, a metal material including W or including W as a main component is preferably from the viewpoint of an embedding property and thermal stability.

A material for the interlayer insulating film may generally be a film having a low dielectric constant such as a silicon dioxide film and an insulating film including fluorine, carbon, or what is called a porous film which forms fine pores in the insulating film. As the interlayer insulating film, an insulating material including Si and containing at least one element selected from C, O or H, or a material which uses these configuring elements and contains pores in the film is used. For the insulating material used here, a material having small pore size is desired not so as to penetrate a gas phase raw material which is used for film formation of a metal electrode and a capacitor insulating film used during forming process of the capacitance element formed later. Considering the many of the gas phase raw materials has a size of 0.5-1 nm, a size of the pores is 1 nm or less and preferably 0.5 nm or less. Not limited to the logic circuit 100 and memory circuit 200, a specific inductive capacity of the interlayer insulating film is preferably lower than the silicon dioxide film in order to decrease a parasitic capacity between wirings. Thereby, the parasitic capacity between the wirings can be decreased and delay in a circuit operation can be decreased. Further, multiple the insulating films corresponding to the cap films 6a-6d placed over the metal material configuring multilayer wirings are more preferably insulating films made from silicon, carbon and nitrogen, or films having a diffusion resistance to the metal (a metal diffusion prevention film) made by a stacked structure of the films having these elements.

In the logic circuit 100, the active element 3b and the lowest layer wiring 8a selected from the wirings configuring the multilayer wirings are electrically coupled to two contacts of the cell contact 10 and the coupling contact 13 by serial coupling. By this structure, the logic circuit 100 and the memory circuit 200 can be mounted in a mixed manner over the same semiconductor substrate 1 and design parameters of both circuits can be identical.

Subsequently, a structure of the capacitance element 19 according to this embodiment is described. The capacitance element 19 according to this embodiment is formed as a memory element configuring the memory circuit 200. This capacitance element 19 is embedded in a concave part 40 located in multilayer wiring layers having two layers configured by the cap film 6a, the interlayer insulating film 7a, the cap film 6b, the interlayer insulating film 7b, the cap film 6c and the wirings 8a and 8b. The concave part 40 is configured by a hole 23 and a wiring groove 28 continuously located outside of the hole 23 in a plan view. This wiring groove 28 is located in an extended manner in a predetermined direction from circumference of the hole 23 in which the capacitance element 19 is embedded. In the wiring groove 28, the upper part coupling wiring 18 is embedded. The opening face of this concave part 40 is formed in the same position as the upper surface of the cap film 6c. In other words, in this embodiment, the upper surface 30 of the upper part coupling wiring 18 and the upper surface 34 of the cap film 6c configure the same plane.

In the hole 23, the capacitance element 19 configured by stacking in the form of layer is formed along its side wall in the form of the concave part. An embedded electrode 18c is located so as to embed inside of the concave part. The upper part coupling wiring 18 is formed over the upper part of the embedded electrode 18c. In this embodiment, since the upper part coupling wiring 18 and the embedded electrode 18c are configured by the same material, they are seamlessly formed. In other words, the upper part coupling wiring 18 is embedded in the concave part formed by a lower part electrode 14, a capacitor insulating film 15 and an upper part electrode 16 configuring the capacitance element 19. Therefore, the upper part coupling wiring 18 also acts as an embedded electrode.

These upper part coupling wiring 18 and the embedded electrode can be formed in the same process.

The upper part coupling wiring 18 is embedded in the wiring groove 28, and has an extraction wiring part 18a which is coupled to an upper layer wiring. The extraction wiring part 18a is formed outside of the side wall of the lower part electrode 14. The bottom part and the side wall of the extraction wiring part 18a are covered with the upper part electrode 16. Particularly, at just beneath the extraction wiring part 18a, the upper part electrode 16 and the capacitor insulating film 15 are formed. Here, a barrier metal film may be formed between the upper part electrode 16 and the upper part coupling wiring 18.

The lower part electrode 14 and the upper part electrode 16 function as electrodes for forming a parallel plate capacitance element with sandwiching the capacitor insulating film 15. The lower part electrode 14 and the upper part electrode 16 are more preferably formed by a material such as high melting point metals such as titanium and tantalum, or nitrides thereof, and a material which can increase crystallinity of the capacitor insulating film 15 is preferably used.

For a material for the capacitor insulating film 15, for example, a film having higher specific inductive capacity than the silicon nitride film such as a film made from zirconium dioxide ($ZrO_2$), zirconium aluminate ($ZrAlO_x$) and moreover zirconium dioxide to which lanthanoids such as Tb, Er and Yb are added; oxides containing one of Zr, Ta, Hf, Al, Nb and Si; or oxides containing any of these elements as a main component; and high dielectric constant materials having the perovskite structure containing $SrTiO_3$ are preferably used. By increasing the specific inductive capacity of the capacitor insulating film 15, electrostatic capacity of the capacitance element 19 can be increased.

In this embodiment, the upper part coupling wiring 18 (the extraction wiring part 18a and the embedded electrode 18c) can be configured by, for example, a material including W, TiN, Cu and Al, a material including any of these metal elements as a main component (for example, 95% by weight or more), or a material made of these metal elements. In any cases, atoms which are unavoidably mixed in the manufacturing process are accepted. In this embodiment, reliability of the capacitance element 19 can be improved by using a metal material such as W and TiN as the metal material which has excellent embedding property and is chemically more stable. When Cu is used, a cap film covering the upper part coupling wiring 18 may be formed.

A lower limit value of height in a direction of layer thickness of the multilayer wiring layer of the capacitance element 19 (hereinafter simply referred to as a direction of layer thickness) is one-layer thickness or more, and more preferably two-layer thickness or more. An upper limit value of height in a direction of layer thickness of the capacitance element 19 is not particularly limited. Here, one layer is configured by one wiring layer in the multilayer wiring layer (the interlayer insulating film 7a or 7b) and one cap film 6a, 6b or 6c formed between the wiring layers. The capacitance element 19 of this embodiment may be formed across two layers in the multilayer wiring layer. However, the capacitance element 19 is not limited to this structure and may be formed across any number of layers in the multilayer wiring layer. However, when many wiring layer are occupied in a memory circuit forming region, shortage of wiring resource may occur. Therefore, two layers or so are preferable.

In the upper part coupling wiring 18 configuring the capacitance element 19 according to this embodiment, height in a direction of layer thickness of the extraction wiring part 18a extracted for external coupling is preferably the same as or less than the height in a direction of layer thickness of the wiring 8b of the logic circuit 100, and is more preferably set lower than the height of the wiring 8b. Thereby, the height of the lower part electrode 14 occupying predetermined wiring layer thickness can be increased. Consequently, electrostatic capacity of the capacitance element 19 can be increased. Generally, a layer structure of a semiconductor device is determined to satisfy design parameters. Therefore, in order to form a capacitance element, for example, thickness of a wiring layer cannot be changed. Accordingly, when the capacitance element is formed in the wiring layer, it is required that contact surfaces of the lower part electrode 14, the capacitor insulating film 15 and the upper part electrode 16 which function as an electromagnetic electrostatic capacity are enlarged. In other words, in the present invention, it is required that the height of the lower part electrode 14 is set high. In this embodiment, since the upper part coupling wiring 18 is configured by the same material as the embedded electrode and in an integrated manner, height of the upper part coupling wiring 18 can be set low in order to set the height of the lower part electrode 14 high.

In this embodiment, in a top view, the upper part coupling wiring 18 has the extraction wiring part 18a which extends outside from the region in which the lower part electrode 14 is placed. As coupling to fixed electric potential in order to function the capacitance element 19 as memory cells of the memory circuit 200, the wiring 201 having the fixed electric potential may be coupled to the extraction wiring part 18a. Consequently, a designer of a semiconductor device can realize free wiring layout by using a wiring layer in a region where the lower part electrode 14 exists among wiring layers of the upper layer of the capacitance elements 19. For example, a signal wiring 202 can be used for a backing wiring of a word line or a bit line of the memory circuit 200.

In the wiring layer in the same layer as the capacitance element 19, at least one of the wirings 8a and 8b configuring the logic circuit 100 is formed. More preferably, in the wiring layer in the same layer as the capacitance element 19 (the interlayer insulating film 7a and the interlayer insulating film 7b), the wirings (wirings 8a and 8b) configuring the logic circuit 100 are inevitably formed. In other words, height of the capacitance element 19 in a direction of the layer thickness can be configured as the same height which is equal to the total value of the layer thickness in a direction of the layer thickness of multiple wirings formed in the same layer of the capacitance element. In the wiring layer in the same layer as the capacitance element 19, the layer may have such a configuration that a layer in which only the contact is formed does not exist.

A shape of the capacitance element 19 is not particularly limited, and for example, a cylindrical shape, a T shape and the like can be formed. The capacitance element 19 is formed in the interlayer insulating film made from the same material as the material of an interlayer insulating film configuring the logic circuit 100. In this embodiment, multiple the capacitance elements 19 are formed. In these capacitance elements 19, the lower part electrode 14 thereof may be electrically independent respectively, or a shared lower part electrode 14 for each capacitance element 19 may be electrically coupled.

As shown in FIG. 2, in the memory circuit 200 of the semiconductor device, multiple the capacitance elements 19 are arranged in parallel in a horizontal direction of the substrate. These capacitance elements 19 are formed all together. In any upper surfaces of the upper part coupling wirings 18 of these capacitance element 19, these upper surfaces configures the same plane as the upper surface of the cap film 6c contacting to the upper surface of the wiring 8b. The semiconductor device of this embodiment provides a size of the logic circuit 100 corresponding to the size of the semiconductor device. Consequently, the memory circuit 200 should provide the required number of the capacitance elements 19 in order to configure the semiconductor device. In FIG. 2, a wiring 210 having fixed electric potential is coupled to the extraction wiring part 18a of the capacitance element 19. The electric potential in which the fixed electric potential wiring 201 has can optionally be set by a designer of the memory circuit. According to the first embodiment, multiple the signal wirings 202 may be arranged over the upper part of the capacitance element 19.

In the upper parts of the wiring 201 having the fixed electric potential configuring the memory circuit 200, the signal wiring 202 and the wiring 8c configuring the logic circuit 100 shown in FIG. 2, a wiring layer configured by wirings and an interlayer insulating layer may further be formed. Thereby, the semiconductor device can be configured by forming a commonly used multilayer wiring structure of a semiconductor device. It is clear for those skilled in the art that this configuration of the semiconductor device described above is possible. Therefore, in the present invention, a structure view of wirings located in the further upper layer of the wiring layer in which the wiring 201 having the fixed electric potential, the signal wiring 202 and the wiring 8c are not particularly illustrated.

Subsequently, a manufacturing method of the semiconductor device of the first embodiment is described in detail using drawings. FIGS. 3-24 are process views showing the manufacturing method of the semiconductor device in the first embodiment.

The manufacturing method for the semiconductor device of this embodiment is a manufacturing method for the semiconductor device having a memory circuit 200 and a logic circuit 100 over the same substrate (a semiconductor substrate 1), the method comprises the steps of: forming an insulating layer (a cap film 6a, an interlayer insulating film 7b) over the semiconductor substrate 1; forming a wiring groove (an opening part 37) in the insulating layer, and forming a metal film (a conducting film 38) embedding the wiring groove; forming a cap film over the metal film after planarizing the metal film; forming a concave part 40 by removing a part of the cap film 6c and the insulating layer (a cap film 6a, interlayer insulating films 7a and 7b); embedding a lower part electrode 14, a capacitor insulating film 15 and an upper part electrode 16 in the concave part 40, and forming a metal film for an upper part coupling wiring (a conducting film 39) in the concave part 40 and over the cap film 6c; and forming an upper part coupling wiring 18 by selectively removing the metal film for the upper part coupling wiring (the conducting film 39) over the cap film.

Figure 3:
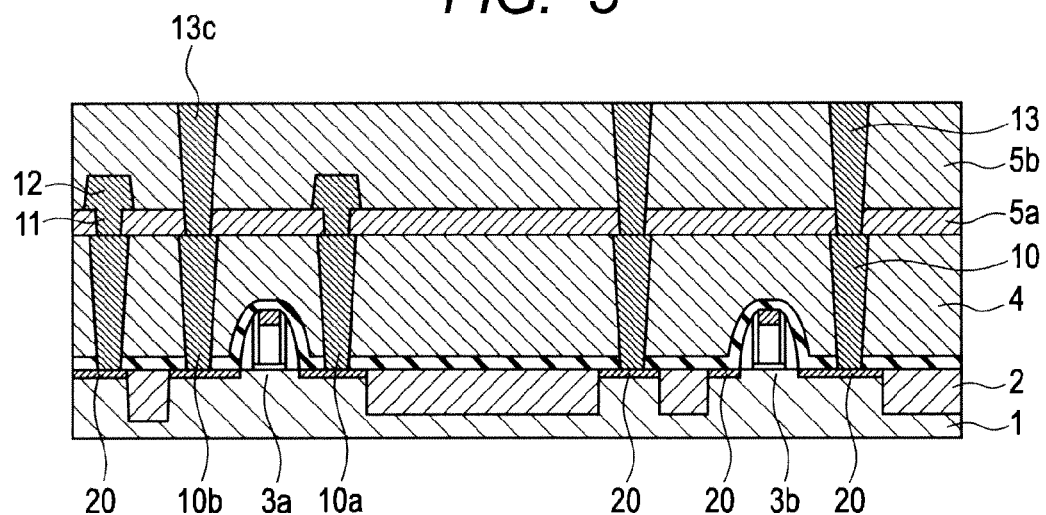
FIG. 3 is a process cross-sectional view showing a manufacturing procedure of the semiconductor device in the first embodiment.

First, as shown in FIG. 3, the element separation film 2 and the active elements 3a and 3b are formed over the semiconductor substrate 1 by a commonly used method. Further, in the upper part of these, each of the contact interlayer insulating film 4, the cell contacts 10, 10a and 10b, the contact interlayer insulating films 5a and 5b, the bit contact 11, the bit line 12, the coupling contact 13 and the capacitor contact 13c are formed. In the manufacturing method of the semiconductor device of this embodiment, a process until formation of the capacitor contact may be performed by a commonly used manufacturing method of a semiconductor device. For example, although not illustrated, the cell contacts 10, 10a and 10b are formed in the following procedure. The contact interlayer insulating film 4 is deposited after formation of the active elements 3a and 3b, and then an opening part which acts as a cell contact is opened by a photolithographic method. Subsequently, a contact material is embedded by a CVD (Chemical Vapor Deposition) method and the excess contact material is removed by a CMP (Chemical Mechanical Polishing) method. Subsequently, an opening part of the bit contact 11 is formed by depositing the contact interlayer insulating film 5a for the bit contact and then applying the photolithographic method and a reactive ion etching method. Subsequently, the bit contact 11 and the bit line 12 are formed by depositing a metal material including W, including W as a main component or made from W by the CVD method, and then applying a photolithographic method and the reactive ion etching method. Further subsequently, the capacitor contact 13c and the coupling contact 13 are formed by depositing the contact interlayer insulating film 5b, planarizing it by the CMP method and then using a method similar to the formation method of the cell contact 10. By going through the processes described above, a structure illustrated in FIG. 3 is realized.

In FIG. 3, over the surface of the diffusion layer region, an alloy of silicon and a metal such as cobalt, nickel and platinum, which is generally referred to as silicide 20, is formed. For gate electrodes of the active elements 3a and 3b, a commonly used polysilicon electrode or a polysilicon electrode in which metal silicide is partially formed may be used, or a metal gate electrode, whose development has been progressed in recent years, may be used. Further, as a formation method of the metal gate electrode, a gate first method or a gate last method are known. Both methods are applicable for both of the memory circuit and the logic circuit according to this embodiment. Consequently, in FIG. 3, a more common polysilicon gate is assumed and illustrated in the drawing. According to a commonly used manufacturing method of the semiconductor device, the cell contacts 10, 10a and 10b, the bit contact 11 and the bit line 12, the capacitor contact 13c and the coupling contact 13 are often formed from tungsten in many cases. However, the range of rights of the present invention shall not be impaired by the material used for the contacts and the bit line. For example, the contacts and the bit line may be configured by copper or an alloy including copper as a main component. In addition, when the contacts are formed, it is common that a barrier metal formed from titanium and nitride thereof at the bottom surface when the contact material is embedded in the opening part. However, since this also does not impinge configuration and effect of this embodiment, the formed barrier metal is not particularly illustrated. More specifically, in the structure and the manufacturing method according to this embodiment, there are characteristics in the structure and the manufacturing method of the capacitance element and the logic circuit wiring positioned in almost same layer of the capacitance element. The structure and effect of this embodiment are not impaired by other parts configuring the logic circuit and the memory circuit. Consequently, a commonly used structure and manufacturing method of the semiconductor device may be used.

The low dielectric constant film described above may be used for at least one layer of the contact interlayer insulating film 4, 5a and 5b. A stacked film formed by different types of low dielectric constant films may be used for these contact interlayer insulating layers. By embedding the low dielectric constant film having an excellent step embedding property (for example, an insulating film deposited by a surface reaction using a plasma polymerization method) in the lower layer, embedding property between narrow pitch gate can be improved and reliability of the semiconductor device can be improved.

Figure 4:
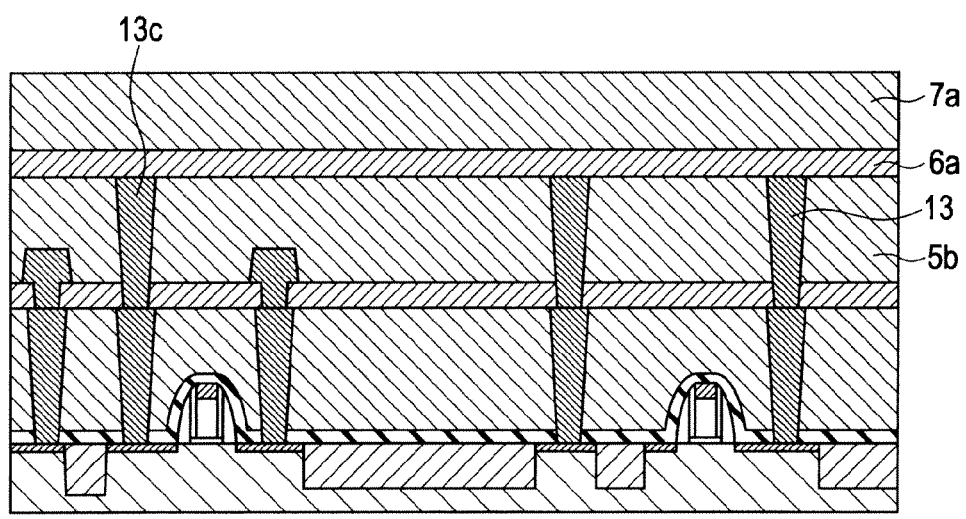
FIG. 4 is a process cross-sectional view showing the manufacturing procedure of the semiconductor device in the first embodiment.

Subsequently, in FIG. 4, the cap film 6a and the interlayer insulating film 7a are embedded over the contact interlayer insulating film 5b having the capacitor contact 13c and the coupling contact 13. When reactive ion etching is performed to the interlayer insulating film 7a, the cap film 6a is more preferably an insulating film functioning as etching stopper having a high selectivity ratio to the interlayer insulating film 7a. However, this insulating film is not always necessary for the structure of this embodiment.

Figure 5:
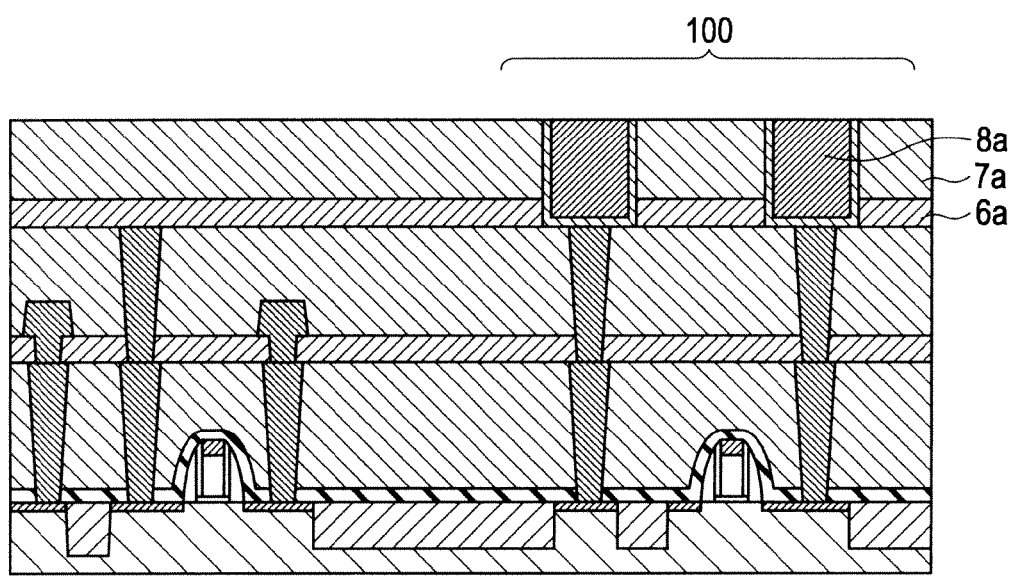
FIG. 5 is a process cross-sectional view showing the manufacturing procedure of the semiconductor device in the first embodiment.

Subsequently, in FIG. 5, the wiring 8a, which is a configuration element of the logic circuit 100, is formed in the cap film 6a and the interlayer insulating film 7a by a commonly used damascene method.

Figure 6:
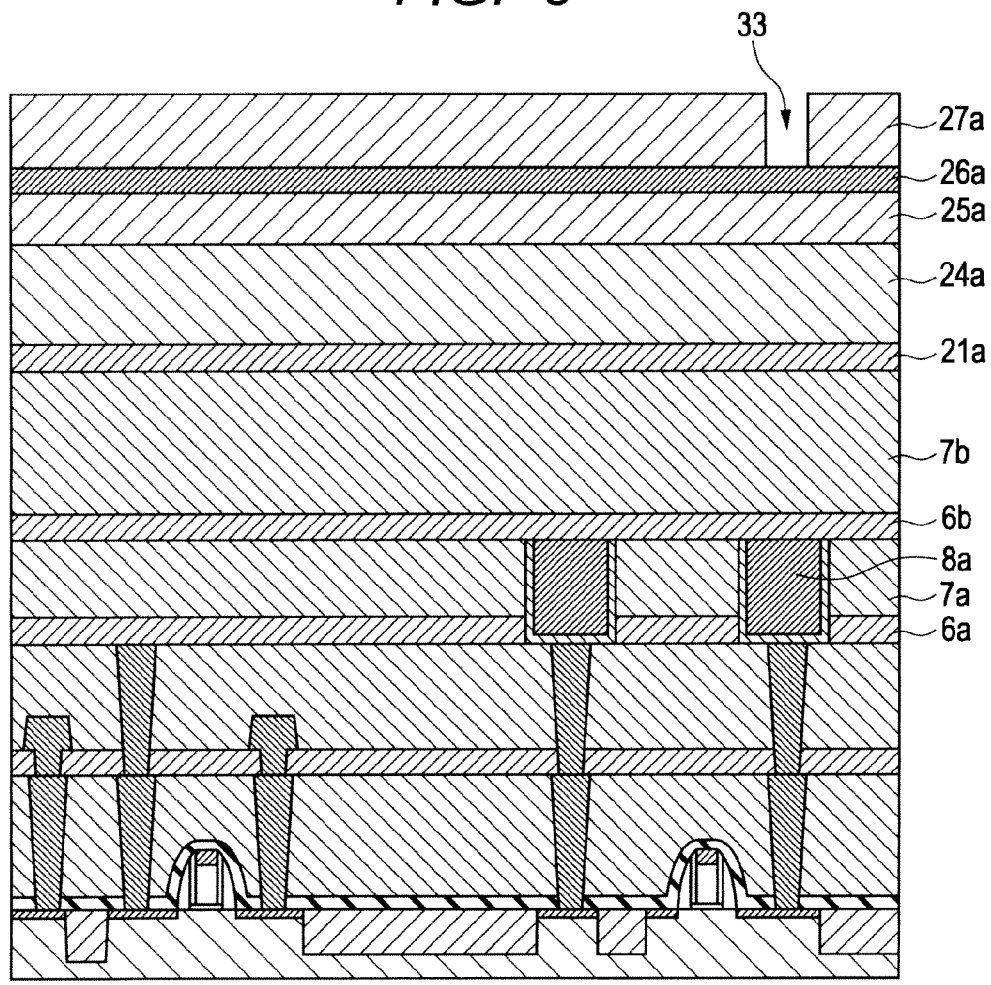
FIG. 6 is a process cross-sectional view showing the manufacturing procedure of the semiconductor device in the first embodiment.

Subsequently, as shown in FIG. 6, the cap film 6b, the interlayer insulating film 7b and a hard mask 21a are embedded over the wiring 8a, and then a multilayer resist layer formed from a lower layer resist 24a (a flat film), a low temperature oxide film 25a, an antireflection film 26a and a photoresist 27a is further formed. An opening part 33 is formed by forming the photoresist 27a by a method such as a coating method, and then transferring a pattern of the desired logic circuit wiring by the photolithographic method.

Figure 7:
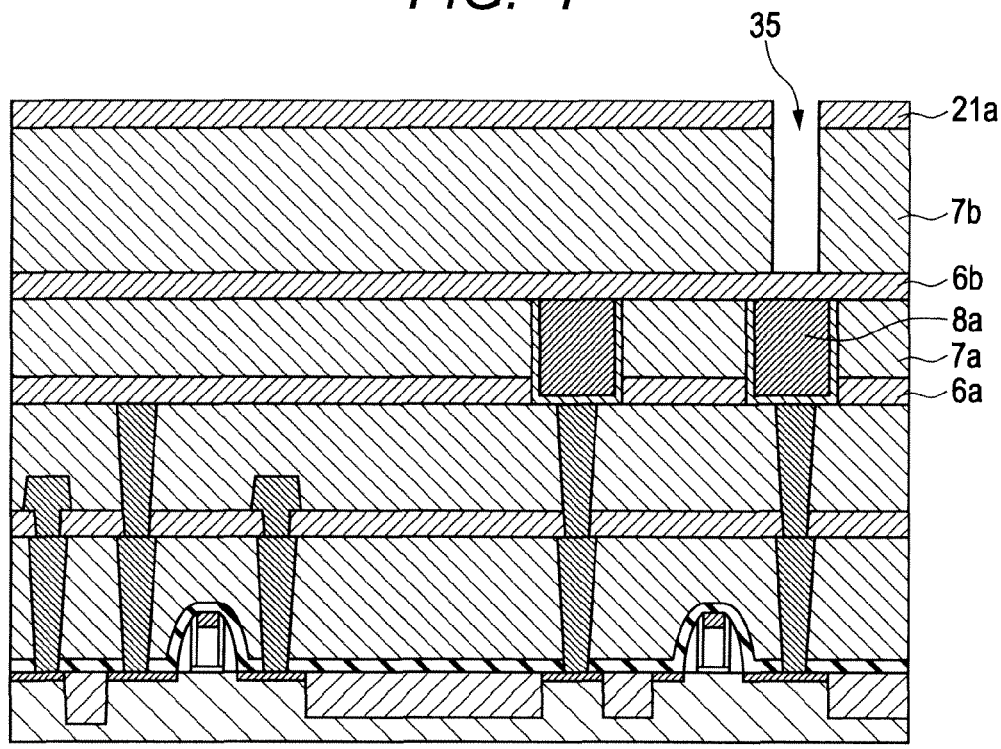
FIG. 7 is a process cross-sectional view showing the manufacturing procedure of the semiconductor device in the first embodiment.

Subsequently, as shown in FIG. 7, an opening part 35 of a via is formed by a method such as the reactive ion etching using the photoresist 27a as a mask. Then, this multilayer resist layer is removed. For example, after removing the photoresist 27a and the like by ashing once, the hard mask 21a is made to remain over the interlayer insulating film 7a.

Figure 8:
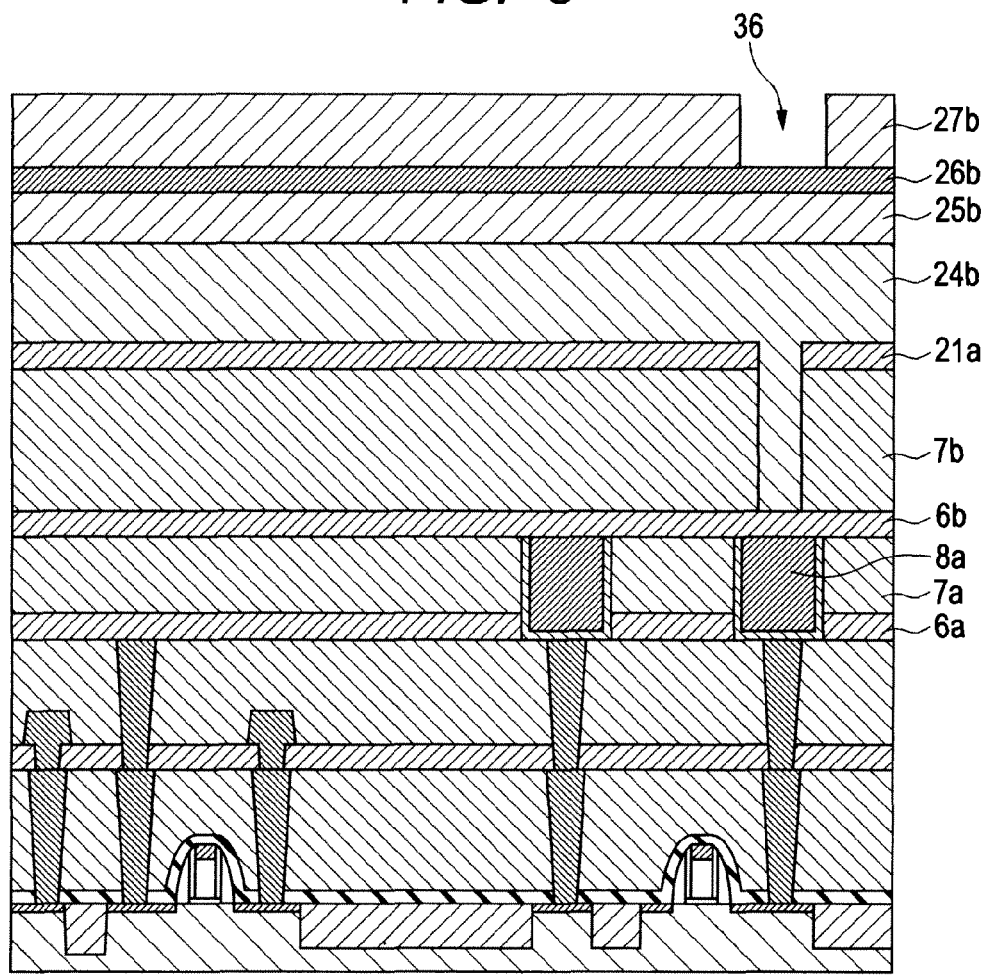
FIG. 8 is a process cross-sectional view showing the manufacturing procedure of the semiconductor device in the first embodiment.

Subsequently, as shown in FIG. 8, a multilayer resist layer formed from a lower layer resist 24b (a flat film), a low temperature oxide film 25b, an antireflection film 26b and a photoresist 27b is formed over the hard mask 21a. In this photoresist 27b, an opening part 36 of a desired circuit pattern is formed by the photolithographic method.

Figure 9:
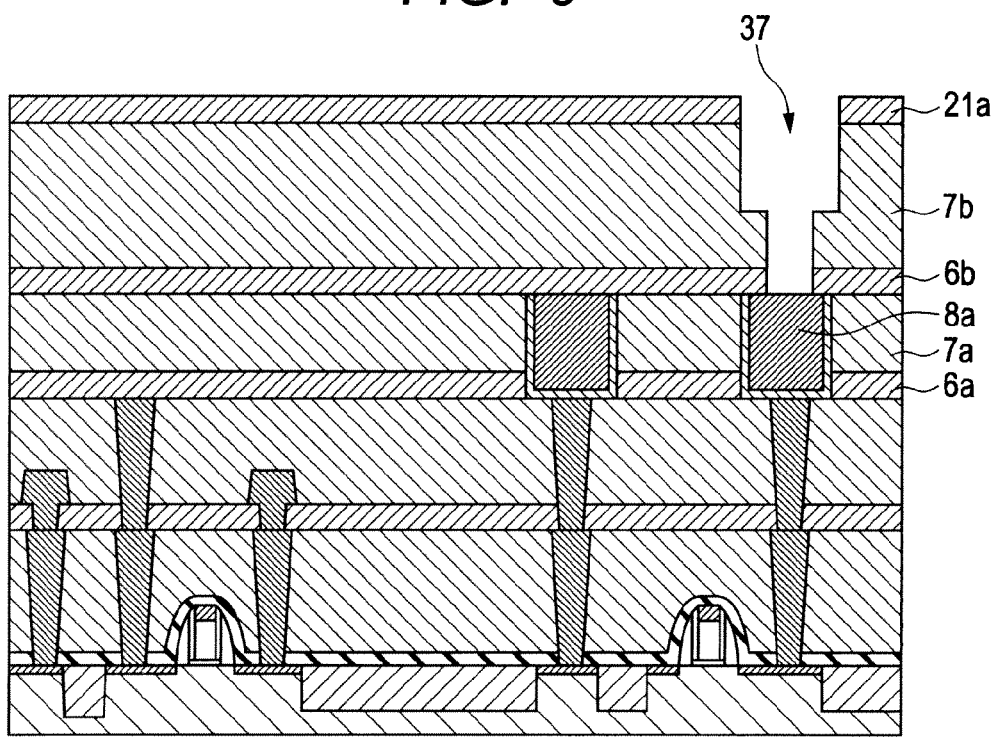
FIG. 9 is a process cross-sectional view showing the manufacturing procedure of the semiconductor device in the first embodiment.

Subsequently, as shown in FIG. 9, an opening part 37 of a wiring is formed by a method such as the reactive ion etching using the photoresist 27b as a mask. After forming the opening part 37 of the wiring, the interlayer insulating film 7b is etched using conditions whose etching rate to the cap film 6b is higher than the etching rate of the interlayer insulating film 7b, and thereby coupling opening part to the wiring 8a of the logic circuit is formed. Then, the multilayer resist layer is removed. Although not illustrated, after forming the opening part 37 of the wiring, the hard mask 21a may be removed by the reactive ion etching.

Figure 10:
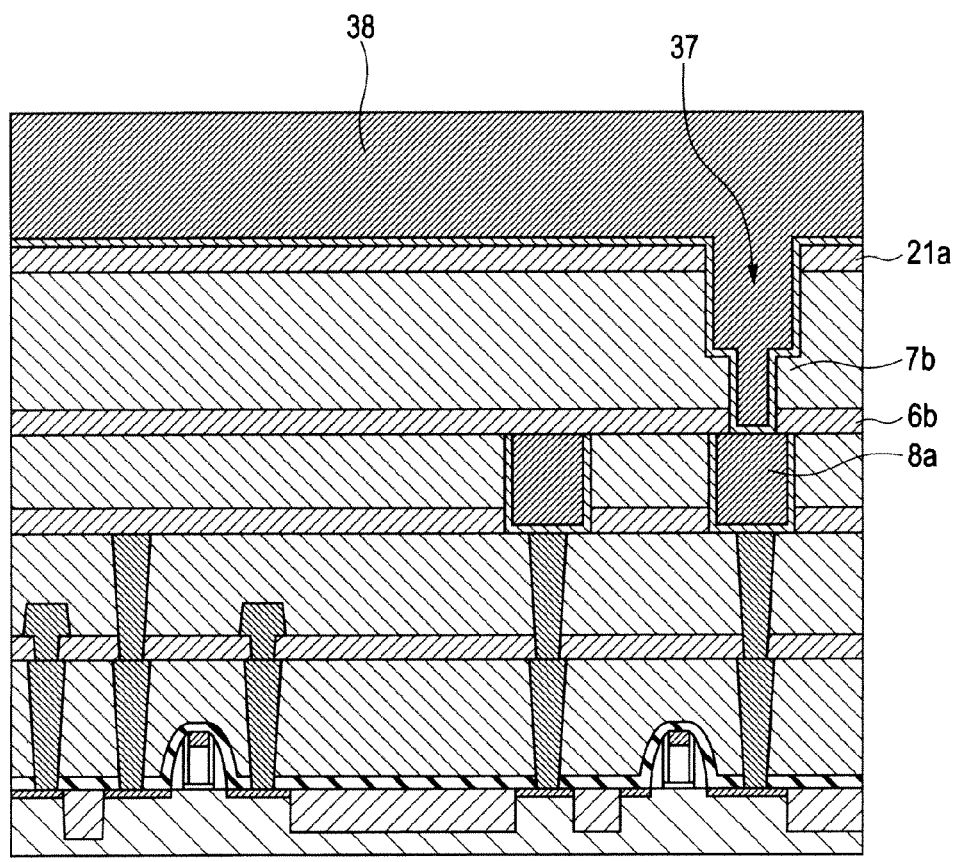
FIG. 10 is a process cross-sectional view showing the manufacturing procedure of the semiconductor device in the first embodiment.

Subsequently, as shown in FIG. 10, a barrier metal film (not illustrated) and a conducting film 38 are embedded in the opening part 37 of the logic circuit wiring at one time. Titanium, tantalum, ruthenium, or nitrides thereof, or further stacked layer film thereof may be used for a material configuring the barrier metal film. The barrier metal film preferably has a configuration in which the conducting film 38 is not diffused. A commonly used material for forming a wiring of a semiconductor device such as copper or an alloy including copper as a main component may be used for the conducting film 38.

Figure 11:
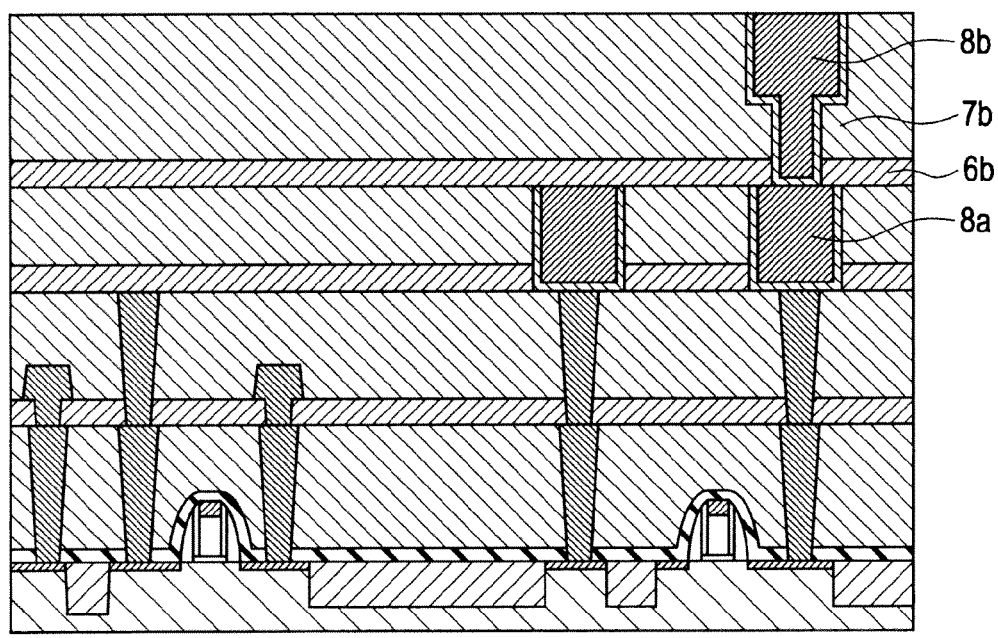
FIG. 11 is a process cross-sectional view showing the manufacturing procedure of the semiconductor device in the first embodiment.

Subsequently, as shown in FIG. 11, the conducting film 38, the barrier metal film and the hard mask 21a are removed by a method such as CMP method or the like, and then the wiring 8b configuring the logic circuit is formed.

Figure 12:
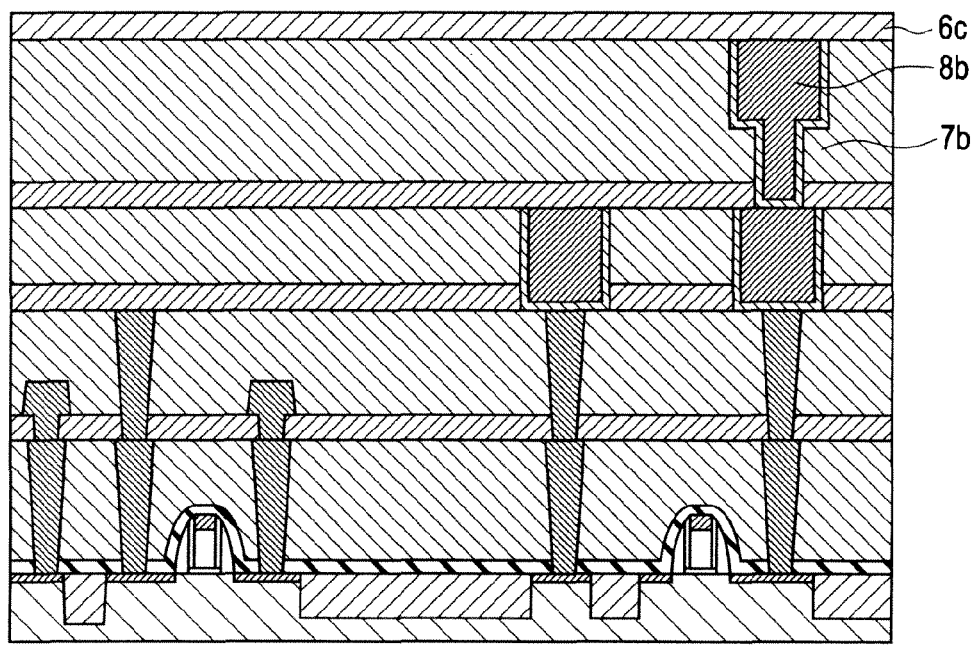
FIG. 12 is a process cross-sectional view showing a manufacturing procedure of the semiconductor device in the first embodiment.

Further, as shown in FIG. 12, the cap film 6c is embedded so as to cover at least the upper surface of the wiring 8b. The cap film 6c, which is similar to the cap film 6a and 6b, is preferably an insulating film in which a material configuring the wiring 8b is not diffused. For example, an insulating film including elements such as silicon, carbon and nitrogen or a stacked layer structure thereof may be included.

Figure 13:
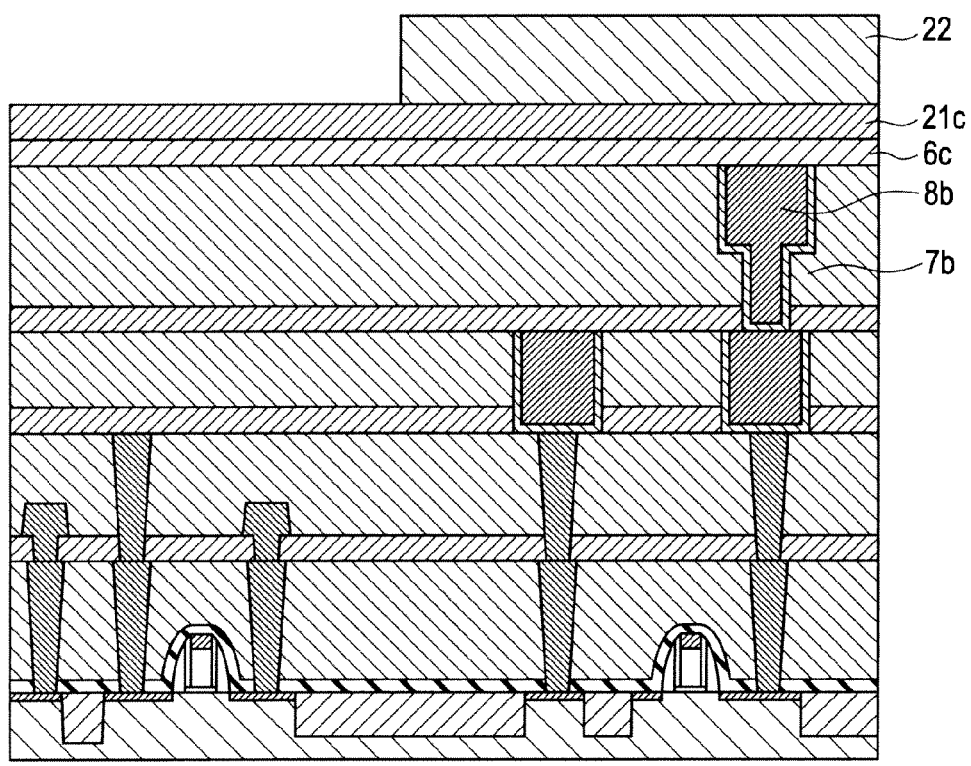
FIG. 13 is a process cross-sectional view showing the manufacturing procedure of the semiconductor device in the first embodiment.

Subsequently, as shown in FIG. 13, an insulating film which acts as the hard mask 21c for processing a cylinder type capacitance element is embedded over the cap film 6c. The hard mask 21c is preferably an insulating film having a high selectivity ratio to the interlayer insulating film 7b when the interlayer insulating film 7b is processed. For example, a silicon dioxide film is preferable. A photoresist 22 is embedded over the hard mask 21c. In the photoresist 22, a desired pattern of the wiring groove of the upper part coupling wiring is formed by a method such as the photolithographic method. Although the photoresist 22 is illustrated as a single layer photoresist in FIG. 13, a multilayer photoresist layer such as a planarized organic film, a silicon dioxide film, an antireflection film and a photosensitive resist, which have been used in recent years, may be used.

Figure 14:
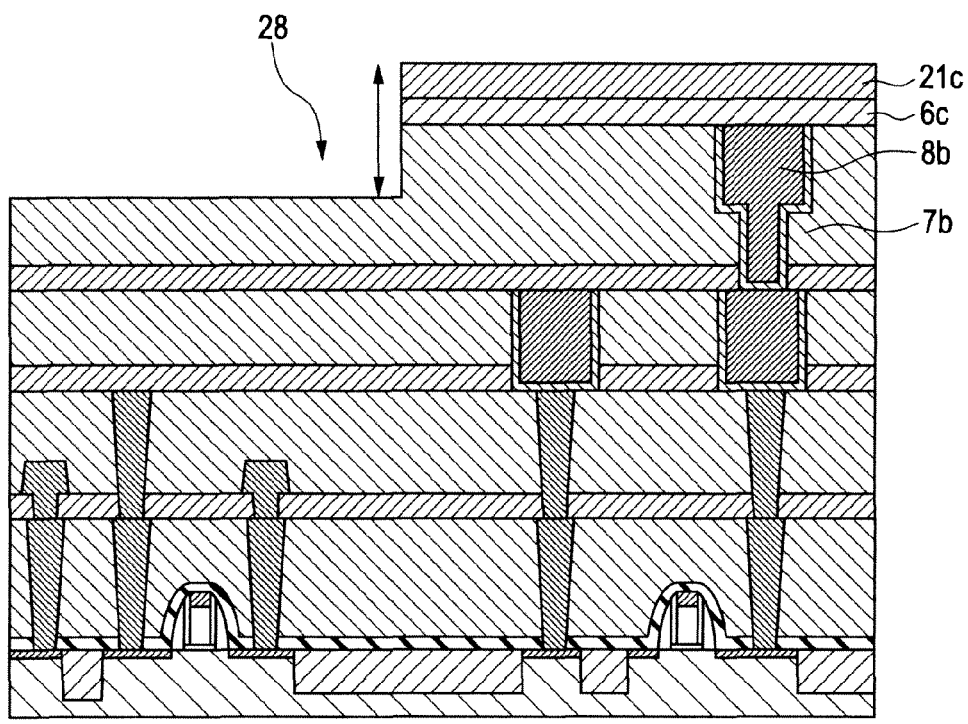
FIG. 14 is a process cross-sectional view showing the manufacturing procedure of the semiconductor device in the first embodiment.

Subsequently, as shown in FIG. 14, the wiring groove 28 of the upper part coupling wiring is formed using the photoresist 22 as a mask in order to configure the upper part coupling wiring of the capacitance element in the cap film 6c and the interlayer insulating film 7b. A method for processing includes, for example, a microfabrication method such as the reactive ion etching. Height of the wiring groove 28 can be controlled by adequately adjusting these etching conditions (for example, a selectivity ratio). In this embodiment, the lower surface of the wiring groove 28 is located lower than the lower surface of the cap film 6c. However, the lower surface of the wiring groove 28 can be formed so that the surface can configures the same plane as the lower surface of the cap film 6c or can be located higher than the lower surface of the cap film 6c.

Figure 15:
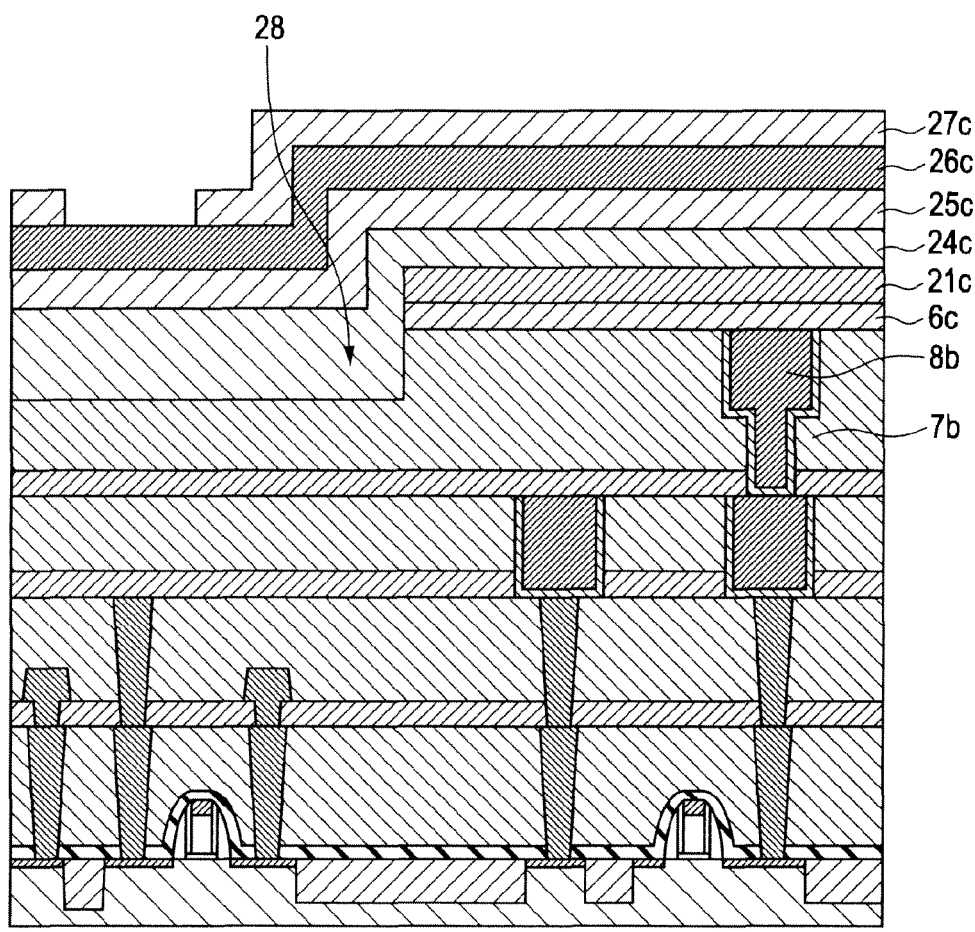
FIG. 15 is a process cross-sectional view showing the manufacturing procedure of the semiconductor device in the first embodiment.

Subsequently, as shown in FIG. 15, a multilayer resist layer formed from a lower layer resist 24c, a low temperature oxide film 25c, an antireflection film 26c and a photoresist 27c is formed over the interlayer insulating film 7b in the wiring groove 28 and over the hard mask 21c. A hole pattern in which a desired capacitance element is embedded is formed in the photoresist 27c by a method such as the photolithographic method.

Figure 16:
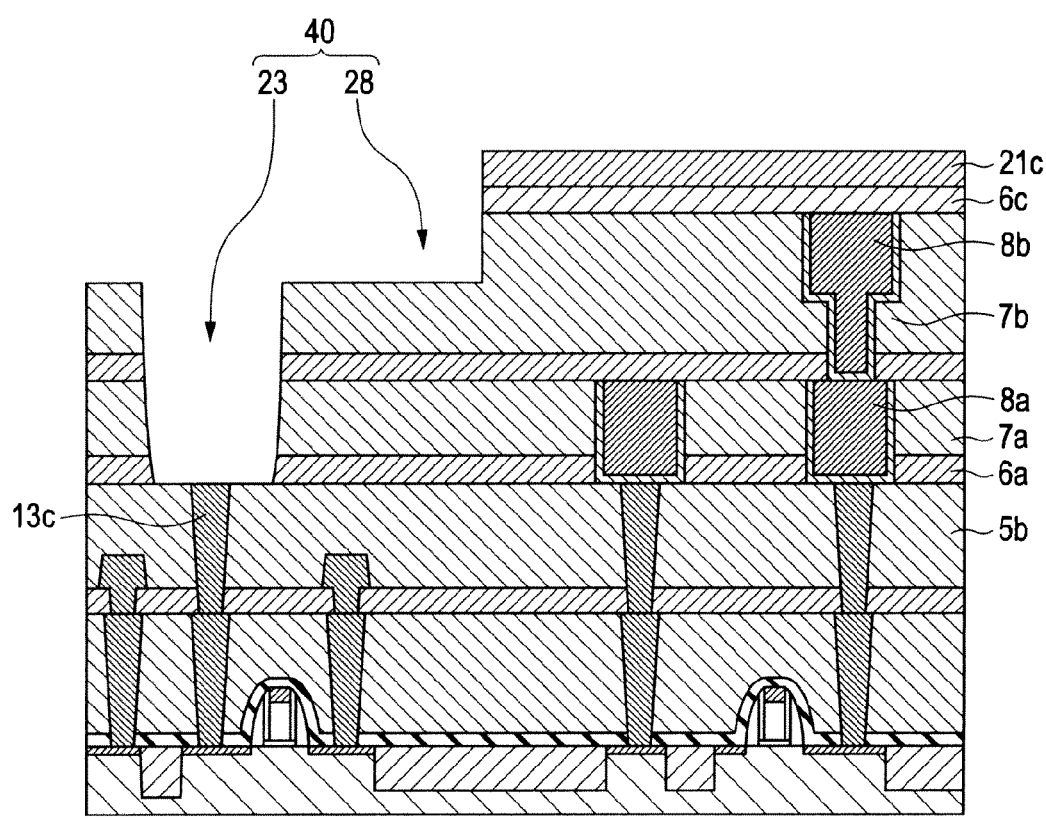
FIG. 16 is a process cross-sectional view showing the manufacturing procedure of the semiconductor device in the first embodiment.

Subsequently, as shown in FIG. 16, the hole 23 is formed using the photoresist 27c as a mask by a microfabrication method such as the reactive ion etching in order to form a cylinder type capacitance element. The multilayer resist layer including the photoresist 27c is removed by performing ashing during processing of the hole 23. The hole 23 may be processed by using the hard mask 21c. Here, in FIG. 16, a cross-sectional view having a state in which the multilayer resist layers including the photoresist 27c are completely removed is shown.

The lower layer resist 24c (a planarized film) deposited outside of the cylinder-shaped hole 23 is removed during the reactive ion etching or after processing the interlayer insulating film 7b by the reactive ion etching. Subsequently, the cap film 6a is processed by the reactive ion etching to form an opening part for coupling to the capacitor contact 13c positioned further lower than the hole 23. As a method for removing the lower layer resist 24c, for example, low dielectric constant films having an excellent resistance property for process damage are more preferably used as the interlayer insulating films 7a, 7b and 7c, when an ashing process by $CO_2$ or $O_2$ is used. For example, as described in Non-patent Document 1, a film having a high resistance property to process damage caused by reactive ion etching is more preferable. For example, an organic silica film having high carbon composition as a preferable example of a low dielectric constant interlayer insulating film is simply described. For example, a film is formed using an organic siloxane having a 6-membered cyclic siloxane as a main skeleton and having organic groups as functional groups as a raw material of the organic silica film. The organic functional groups bonding to a silicon atom is desirably unsaturated hydrocarbon groups and alkyl groups. Examples of unsaturated hydrocarbon groups include vinyl group, propenyl group, isopropenyl group, 1-methyl-propenyl group, 2-methyl-propenyl group and 1,2-dimethyl-propenyl group. The particularly preferable unsaturated hydrocarbon group is vinyl group. As alkyl groups, functional groups being spatially bulky and functioning as a steric hindrance groups such as isopropyl group, isobutyl group and tert-butyl group. By using these materials, very fine (mainly 0.5 nm or less) closed pores structure can be introduced into the organic silica film. Although a SCC film is one of SiOCH films, the film has a resistance property of copper diffusion and has characteristics in that the film has higher carbon composition than a commonly known SiOCH film. In other words, the film includes carbon about four times a common SiOCH film compared in a ratio of carbon/silicon. On the other hand, the film has a relatively lower element ratio of oxygen to the common SiOCH film and the ratio is about ½. As a film formation method of the SCC film, the film is formed by not plasma CVD which dissociates and activates raw materials in the plasma, but plasma polymerization, and thereby unsaturated hydrocarbon is activated on a priority base with maintaining silica skeleton. Thereby, the SCC film formation is realized because control of a chemical structure of the insulating film becomes easy. As described above, a film having high resistance property to process damage can be obtained by obtaining an organic silica film having high carbon composition.

In this embodiment, it is described that the manufacturing method in which the wiring groove 28 of the upper part coupling wiring is firstly formed and then the hole 23 in which the capacitance element is embedded is formed. However, a method which forms the hole 23 in which the capacitance element is firstly embedded, and then the wiring groove 28 of the upper part coupling wiring is formed may also be performed.

Figure 17:
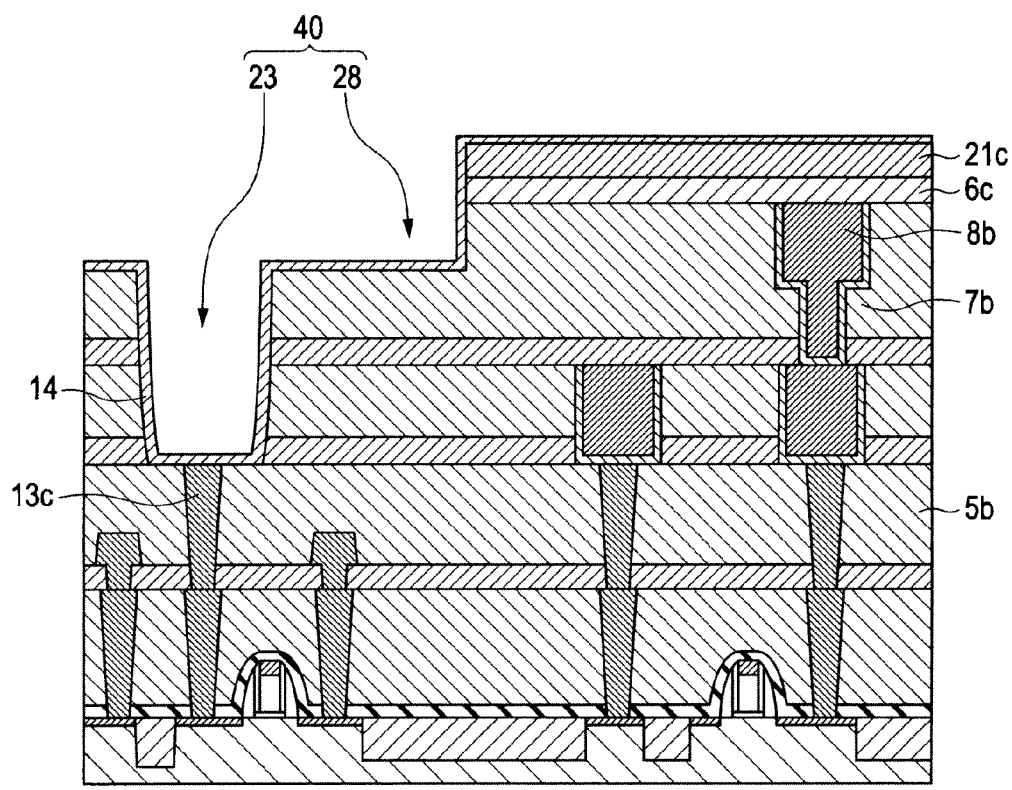
FIG. 17 is a process cross-sectional view showing the manufacturing procedure of the semiconductor device in the first embodiment.

Subsequently, as shown in FIG. 17, the lower part electrode 14 is deposited in the hole 23 and the wiring groove 28 which are formed by the manufacturing method shown by FIG. 16. As a method for forming the lower part electrode 14, a method for commonly forming a semiconductor device such as the CVD method, a sputtering method, an ALD (an Atomic Layer Deposition) method may be used. Here, before depositing the lower part electrode 14, for example, the surface may be etched by RF sputtering and the like in order to improve a contact property to the capacitor contact 13c. However, effect of the present invention is not impaired whether these pretreatments are preformed or not. Therefore, detailed description is omitted. As a material for configuring the lower part electrode 14, high melting point metals and nitrides thereof such as titanium and nitride thereof, tantalum and nitride thereof and ruthenium or stacked structures thereof may be used. According to the manufacturing method of this embodiment, the lower part electrode 14 is formed by using a TiN film.

Figure 18:
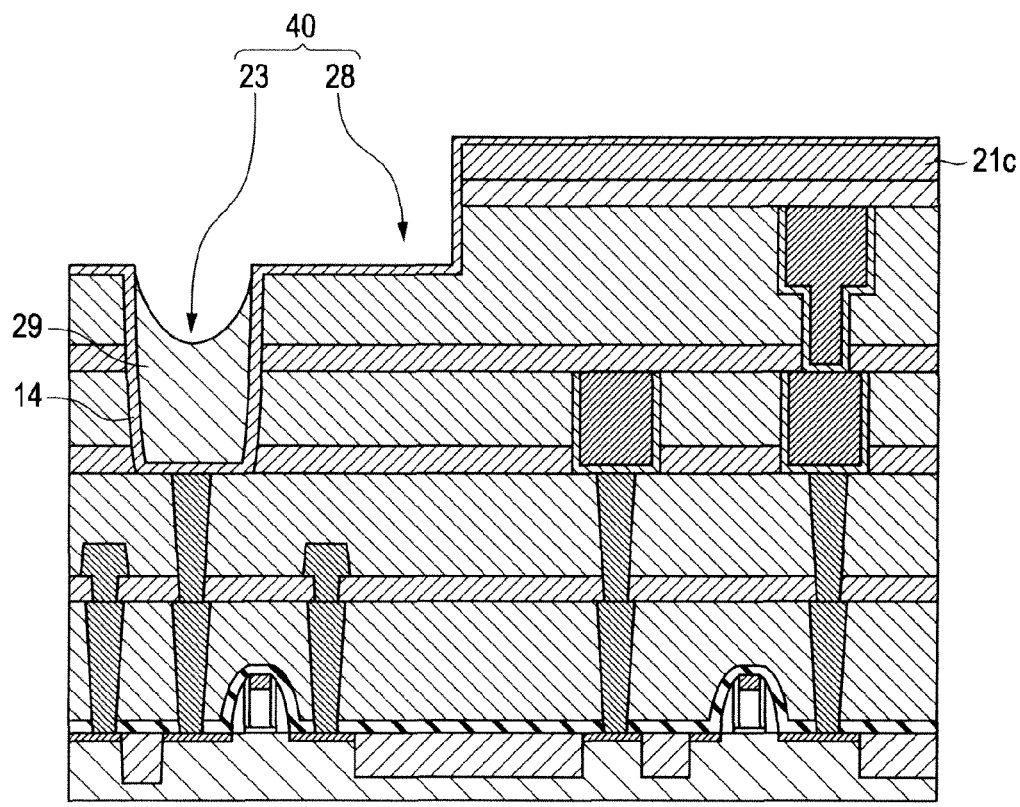
FIG. 18 is a process cross-sectional view showing the manufacturing procedure of the semiconductor device in the first embodiment.

Subsequently, as shown in FIG. 18, the photoresist 29 is embedded in the hole 23 of the cylinder type capacitor in which the lower part electrode 14 is deposited by, for example, a coating method. It is preferable that the photoresist 29 only remains inside the hole 23 and is formed in height not reaching to the upper end of the hole 23. Unnecessary photoresist may be removed by exposing and developing the photoresist 29, if necessary.

Figure 19:
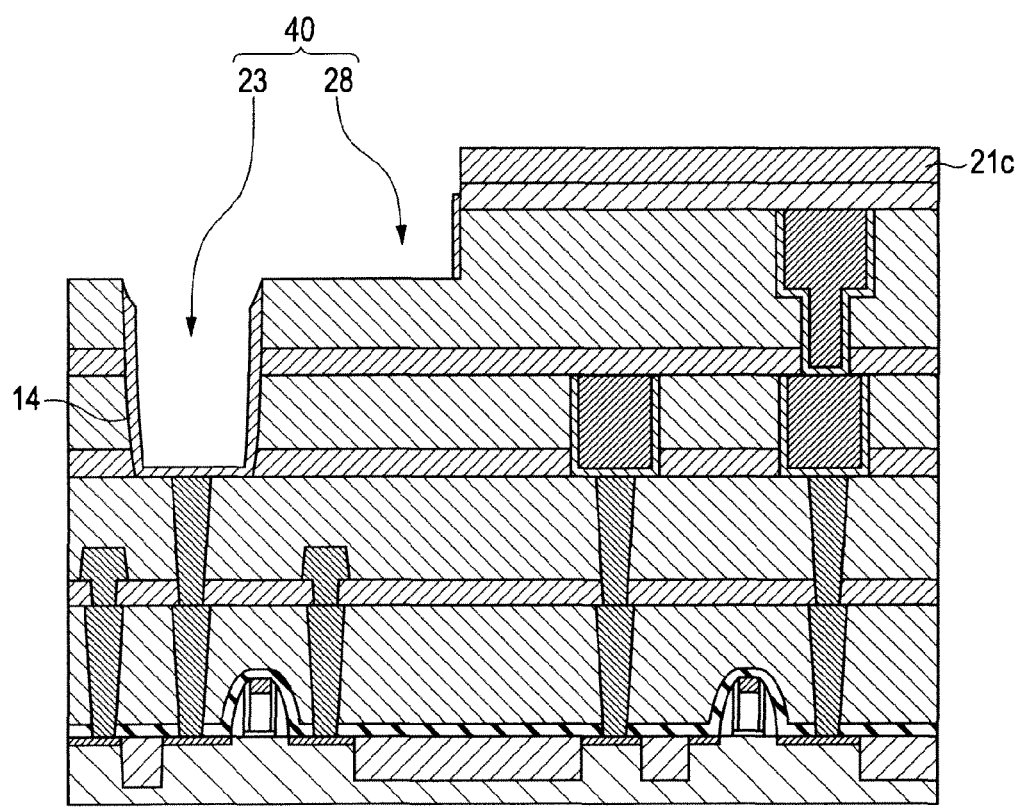
FIG. 19 is a process cross-sectional view showing the manufacturing procedure of the semiconductor device in the first embodiment.

Subsequently, as shown in FIG. 19, the lower part electrode 14 is etched back by a method such as the reactive ion etching method. As shown in FIG. 18 described above, the etch back is performed in a state in which the photoresist 29 remains only in the hole 23, and thereby the lower part electrode 14 having height which does not reach the highest layer of the opening part 23 like the capacitance element 19 can be formed.

Figure 20:
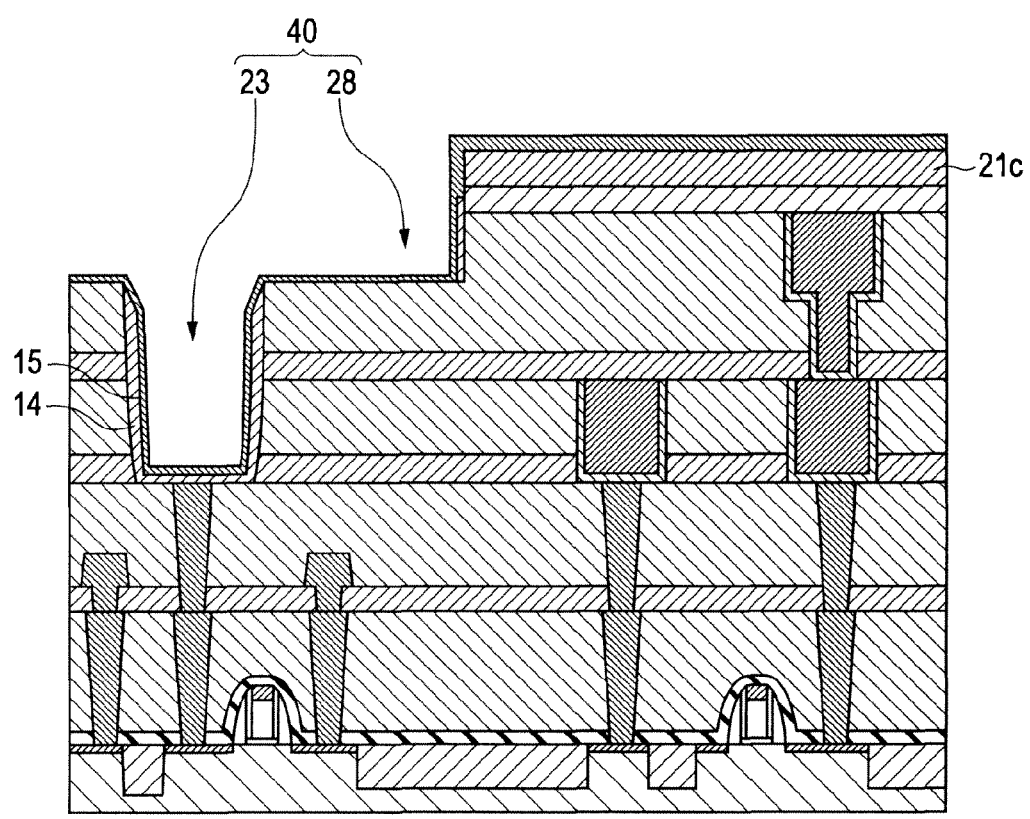
FIG. 20 is a process cross-sectional view showing the manufacturing procedure of the semiconductor device in the first embodiment.

Subsequently, as shown in FIG. 20, the capacitor insulating film 15 is embedded over the lower part electrode 14. In other words, the capacitor insulating film 15 is formed so as to cover over at least the hole 23 and the wiring groove 28. As a method for forming the capacitor insulating film 15, usually a method used for forming a semiconductor device such as the CVD method, the sputtering method and the ALD method may be used. However, use of the ALD method which can deposit a thin film having a thickness of several nm in good uniformity is more preferable in order to improve electrostatic capacity of the capacitance element. For the capacitor insulating film 15, films formed from zirconium dioxide ($ZrO_2$), zirconium aluminate ($ZrAlO_x$) and further a film formed by adding lanthanoids such as Tb, Er and Yb to zirconium dioxide may be used. According to the manufacturing method of this embodiment, $ZrO_2$ is used for forming the capacitor insulating film 15. Although not illustrated, sintering for increasing crystallization can be performed, after depositing the capacitor insulating film 15.

Figure 21:
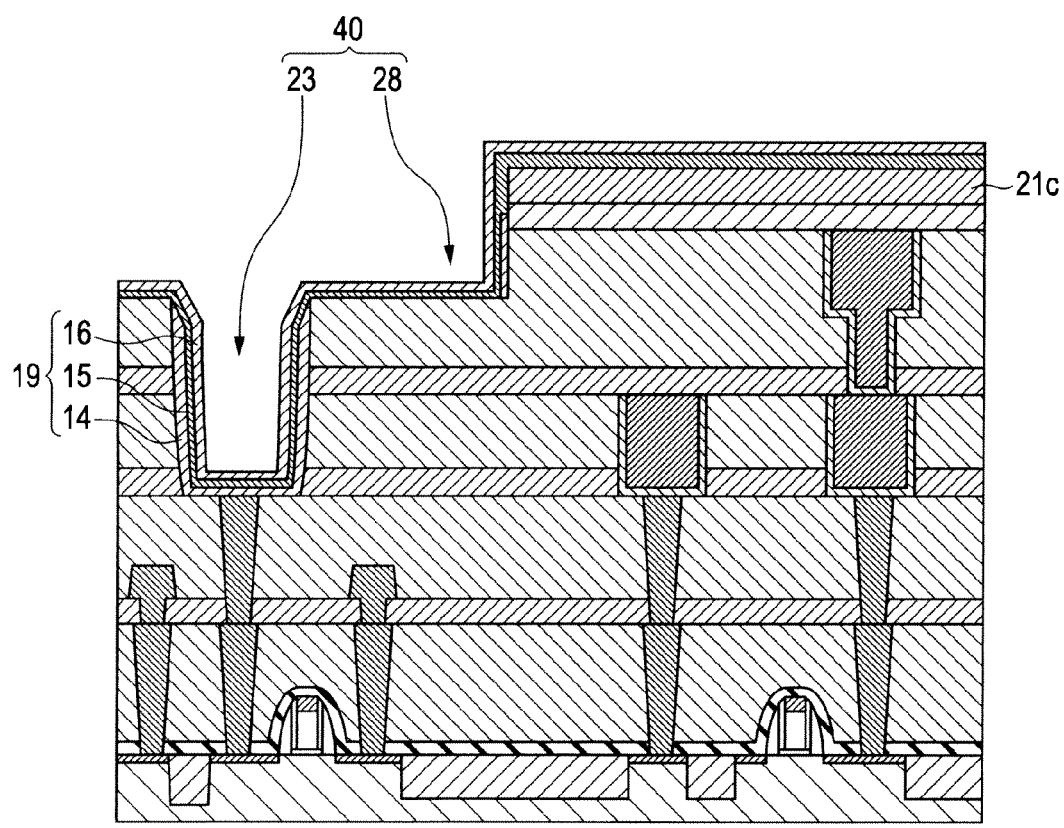
FIG. 21 is a process cross-sectional view showing the manufacturing procedure of the semiconductor device in the first embodiment.

Subsequently, as shown in FIG. 21, the upper part electrode 16 is deposited over the capacitor insulating film 15. In other words, the upper part electrode 16 is formed so as to cover over at least the hole 23, the wiring groove 28 and the hard mask 21c. At this time, the upper part electrode 16 may cover over the whole upper surface of the semiconductor substrate 1. As a material for configuring the upper part electrode 16, for example, the high melting point metals and nitrides thereof such as titanium and nitride thereof, tantalum and nitride thereof and ruthenium or stacked structures thereof may be used. As a method for forming the upper part electrode 16, a method for commonly forming a semiconductor device such as the CVD method, the sputtering method and the ALD method may be used. According to the manufacturing method of this embodiment, the upper part electrode 16 is formed by using a TiN film.

Figure 22:
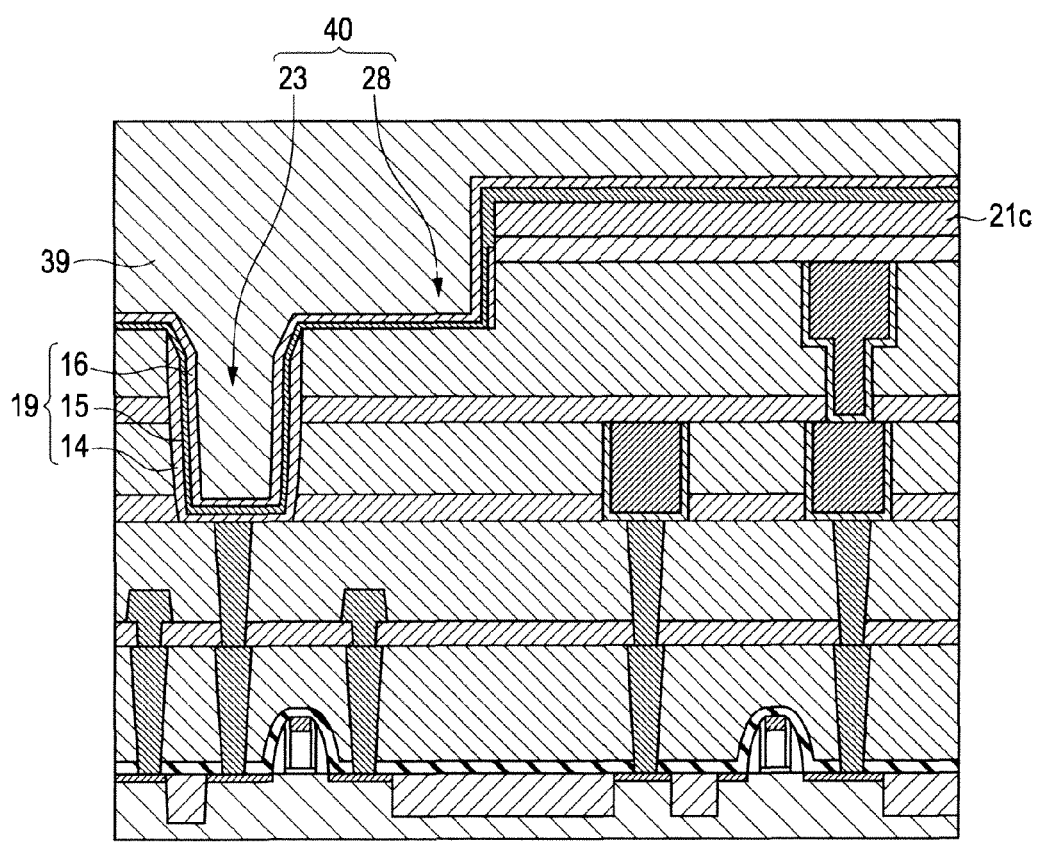
FIG. 22 is a process cross-sectional view showing a manufacturing procedure of the semiconductor device in the first embodiment.

Subsequently, as shown in FIG. 22, the conducting film 39 is formed over the hard mask 21c of the logic circuit so as to embed in the hole 23 and the wiring groove 28. For the conducting film 39, metal materials containing W, TiN, Cu and Al, or alloys including these metal materials as a main component can be used.

Figure 23:
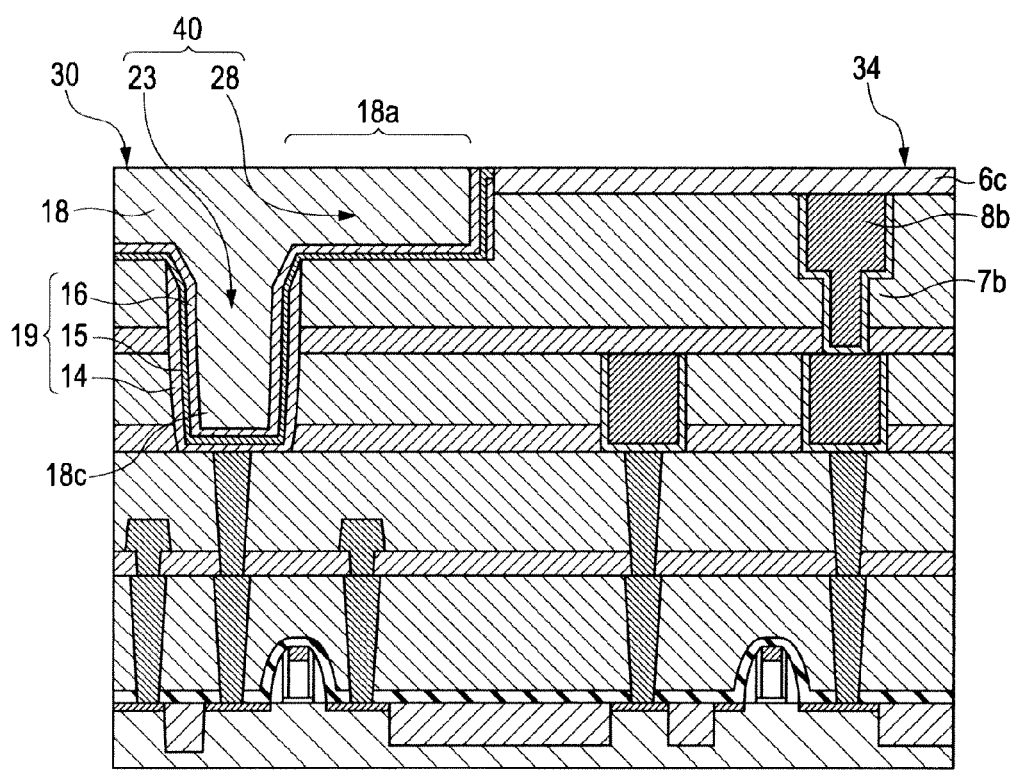
FIG. 23 is a process cross-sectional view showing the manufacturing procedure of the semiconductor device in the first embodiment.

Subsequently, as shown in FIG. 23, the conducting film 39 and the hard mask 21c are removed by a method such as the CMP method. Thereby, the upper part coupling wiring 18 is embedded in the wiring groove 28.

Figure 24:
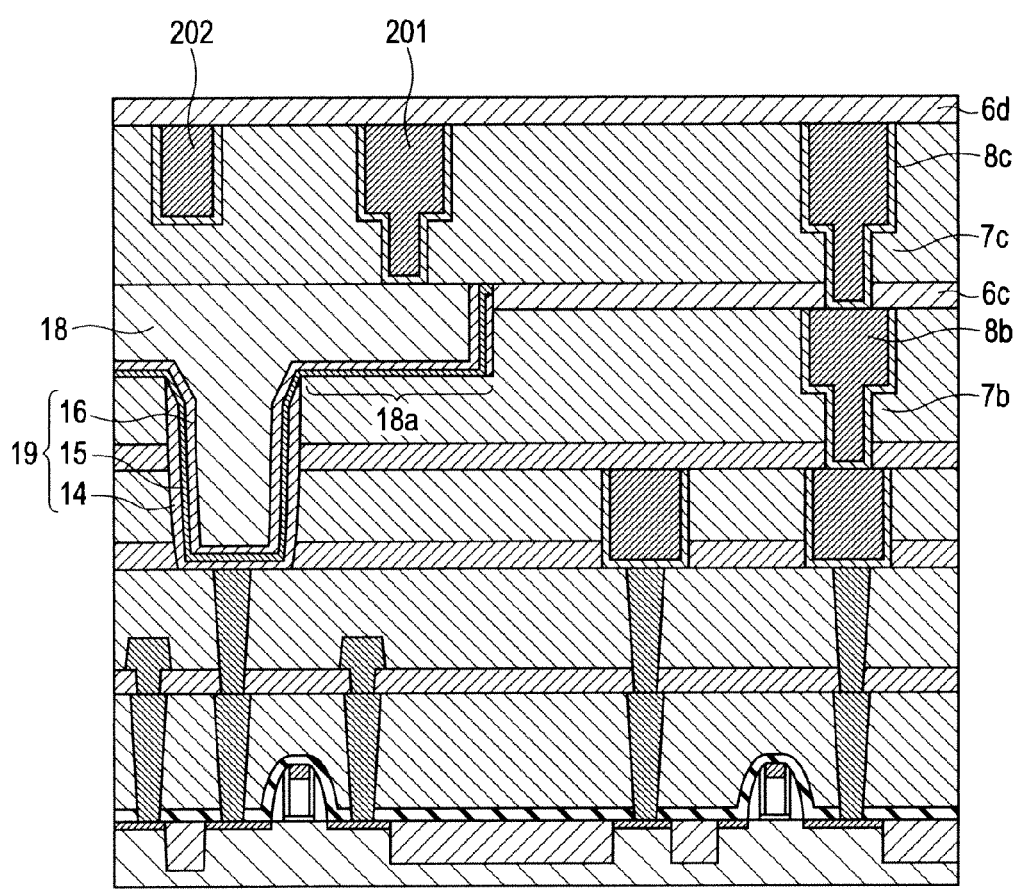
FIG. 24 is a process cross-sectional view showing the manufacturing procedure of the semiconductor device in the first embodiment.

Subsequently, as shown in FIG. 24, the interlayer insulating film 7c, the wiring 201 having fixed electric potential, the signal wiring 202, the wiring 8c and the cap film 6d are formed in a further upper layer of the capacitance element 19 configuring the memory circuit and the wiring 8b which is positioned in the same layer as the upper part coupling wiring 18 of the capacitance element 19 by a commonly used manufacturing method of a semiconductor device. By the methods described above, the semiconductor device of this embodiment can be obtained.

Subsequently, operation and effect of the first embodiment is described. In this embodiment, the capacitance element 19 is embedded in the multilayer wiring layer. Not only that, but also at least one wiring layer (the wiring 8a configuring the logic circuit 100 and the interlayer insulating film 7a) is located in this capacitance element 19. By this structure, a thickness of the multilayer wiring layer can be suppressed to become thick with securing a capacity of the capacitance element 19. Thereby, a contact height of the logic circuit 100 can be suppressed low, and increase in parasitic resistance and parasitic capacity caused by insertion of the capacitance element 19 can be suppressed.

In this embodiment, the upper surface 30 of the upper part coupling wiring 18 formed in the region of the memory circuit 200 and the upper surface 34 of the cap film 6c formed in the logic circuit region and located so as to contact to the upper surface of the wiring 8b configure the same plane. Since the same plane is formed as described above, height of the concave part 40 can be set high by a thickness of the cap film, compared with the related art described in, for example, Patent Document 1. Consequently, height of the capacitance element 19 embedded in the concave part 40 can be set higher. Thereby, according to this embodiment, increase in capacity of the capacitance element 19 can be realized compared with the related art.

CMP treatments of the upper part coupling wiring 18 of the capacitance element 19 and the wiring 8b of the logic circuit 100 can be separately performed. Consequently, reliability of the capacitance element can be further improved by using a low resistance metal material such as copper for the wiring 8b configuring the logic circuit 100 and by using a metal material such as tungsten having excellent embedding property and chemical stability as an electrode material for a metal electrode of the capacitance element 19.

When the metal electrode of the capacitance element 19 is treated by the CMP treatment, a film thickness of the metal electrode of the capacitance element 19 can be determined in a self-aligning manner by employing process being automatically stopped at the upper surface of the cap film 6c. In other words, residual conducting film 39 can be eliminated over the cap film 6c. Consequently, an interval between the metal electrode (the upper part coupling wiring 18) of the capacitance element 19 and the wiring 8c configuring the upper layer logic circuit 100 can be precisely controlled. Consequently, short circuit failure between the metal electrode (the upper part coupling wiring 18) of the capacitance element 19 and the wiring 8c configuring the upper layer logic circuit 100 can be suppressed and yield of the capacitance element 19 can be improved with securing capacity of the capacitance element 19.

Since the upper part coupling wiring 18 and the embedded electrode 18c is configured by the same material, they are formed in the same process. In other words, when the upper part coupling wiring 18 is formed, etch back of the embedded electrode is not necessary in order to secure space for formation of the upper part coupling wiring as shown in Patent Document 1. Consequently, excess etching of the embedded electrode is suppressed. Consequently, the reliability is improved and the yield is excellent. In addition, manufacturing cost is reduced by using the same material. Since the upper part coupling wiring 18 and embedded electrode 18c are formed from the same material at the same time, they are seamlessly configured. Consequently, the contact resistance of the semiconductor device can be reduced because the interface does not exist.

In the upper part coupling wiring 18 configuring the capacitance element 19, height of the extraction wiring part 18a extracted for external coupling can be lower than wiring height of the wiring 8b of the logic circuit 100. Thereby, height of the capacitor insulating film 15 configuring the capacitance element 19 can be set high. Consequently, effective electrostatic capacity of the capacitance element 19 can be improved and operating margin of the memory circuit 200 can be widened.

The capacitance element 19 is formed in an interlayer insulating film formed from the same material as the interlayer insulating film material configuring the logic circuit 100. In other words, the interlayer insulating film 7a of the multilayer wiring layer in which the capacitance element 19 is embedded is common with the interlayer insulating film 7a where the wiring 8a formed in the same layer as the capacitance element 19 is located. In addition, since the interlayer insulating film 7a has lower specific inductive capacity than a silicon dioxide film, parasitic capacity of the capacitance element 19 can be decreased.

Design parameters for designing the logic circuit can be common with design parameters for designing a semiconductor device formed by mounting the memory circuit and the logic circuit in a mixed manner over the same semiconductor substrate, and thereby design cost of the semiconductor device can be reduced.

A low dielectric constant film can be used as at least one layer among insulating film materials involving a coupling part coupling the active elements 3a and 3b and the bit line 12. Further, by using the low dielectric constant film as the contact interlayer film, delay caused by parasitic capacity of the contact interlayer film can be reduced and high performance of the semiconductor device can be obtained. Since difference between design parameters of a Pure-Logic chip and design parameters of a Logic part of a DRAM mounted in a mixed manner can be small. Thereby, the number of man-hour for redesign when IP designed in the Pure-Logic chip is used in the DRAM mounted in a mixed manner can be reduced. By using the low dielectric constant film for a bit line layer, parasitic capacity of the bit line becomes lower and signal voltage margin at the time of DRAM readout can be widened. Thereby, reliability of the operation also can be improved.

A manufacturer or a designer of the semiconductor device may determine that the low dielectric constant film is used for any one of contact interlayer insulating films 4, 5a and 5b. This determination may be done based on comparing circuit performance of the logic circuit of the semiconductor device having the memory circuit mounted in a mixed manner with circuit performance of the logic circuit of the semiconductor device not having the memory circuit mounted in a mixed manner, and setting performance degradation caused by mounting the memory circuit in a mixed manner within an acceptable range. In this embodiment, the capacitance element is formed by embedding in the interlayer insulating film configuring the wiring of the logic circuit. Thereby, height of the contact becomes high. As a result, parasitic resistance and parasitic capacity of the active elements in the logic circuit are increased, and cause of operation speed decrease of the logic circuit and the like can be suppressed.

As described above, this embodiment is applicable to semiconductor devices having transistors and multilayer wirings. By preferably applying this embodiment, mixed mounting of the memory circuit and the logic circuit can be achieved over the same semiconductor substrate in low cost and excellent yield.

Second Embodiment

Figure 25:
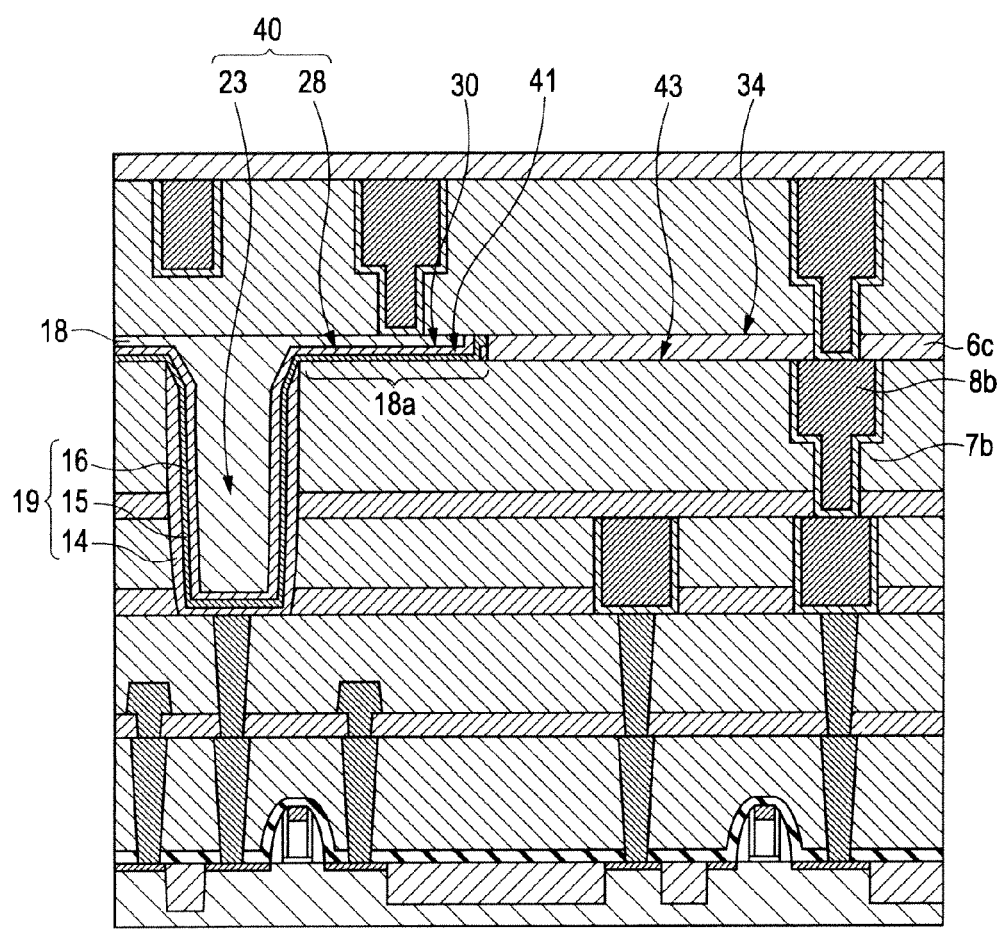
FIG. 25 is a cross-sectional view schematically showing a semiconductor device in a second embodiment.

Subsequently, a semiconductor device of a second embodiment is described using the drawing. FIG. 25 is a cross-sectional view showing the semiconductor device in the second embodiment. The second embodiment is similar to the first embodiment except that the concave part 40 is configured by the hole 23 in which the capacitance element 19 is embedded and the wiring groove 28 which is continuously provided outside of the hole 23 and in which the upper part coupling wiring 18 is embedded, and the lower surface 41 of the wiring groove 28 and the lower surface 43 of the cap film 6c configure the same plane. Here, the same plane is defined in the same way as the first embodiment.

In the second embodiment, since the lower surface 41 of the wiring groove 28 and the lower surface 43 of the cap film 6c configure the same plane, a film thickness of the upper part coupling wiring 18 can be thinner. As a result, height of the hole 23 in which the capacitance element is embedded can be high compared with the first embodiment. Consequently, capacity of the capacitance element 19 can be increased because an area of the capacitance element 19 located along the inner wall of the hole 23 can be increased. By this configuration, short circuit failure between the metal electrode of the capacitance element 19 and the wiring 8c configuring the logic circuit in the upper layer can be suppressed and thereby DRAM operation can be stabilized with securing capacity of capacitance element 19 compared with the case of the first embodiment. The second embodiment can obtain the effect similar to the first embodiment.

The lower surface 41 of the wiring groove 28 is located higher than the lower surface 43 of the cap film 6c. In other words, height of the wiring groove 28 (for example, a film thickness from the embedded electrode 18c to the capacitor insulating film 15 just beneath the electrode) may be set thinner than a film thickness of the cap film 6c.

A manufacturing method for the semiconductor device in the second embodiment is almost the same as the manufacturing process of the first embodiment. However, in a process for forming the wiring groove 28 of the upper part coupling wiring 18, it is different in that etching of the wiring groove 28 is only performed to the cap film 6c in a condition having selectivity to the low dielectric constant film (the interlayer insulating film 7b).

Third Embodiment

Figure 26:
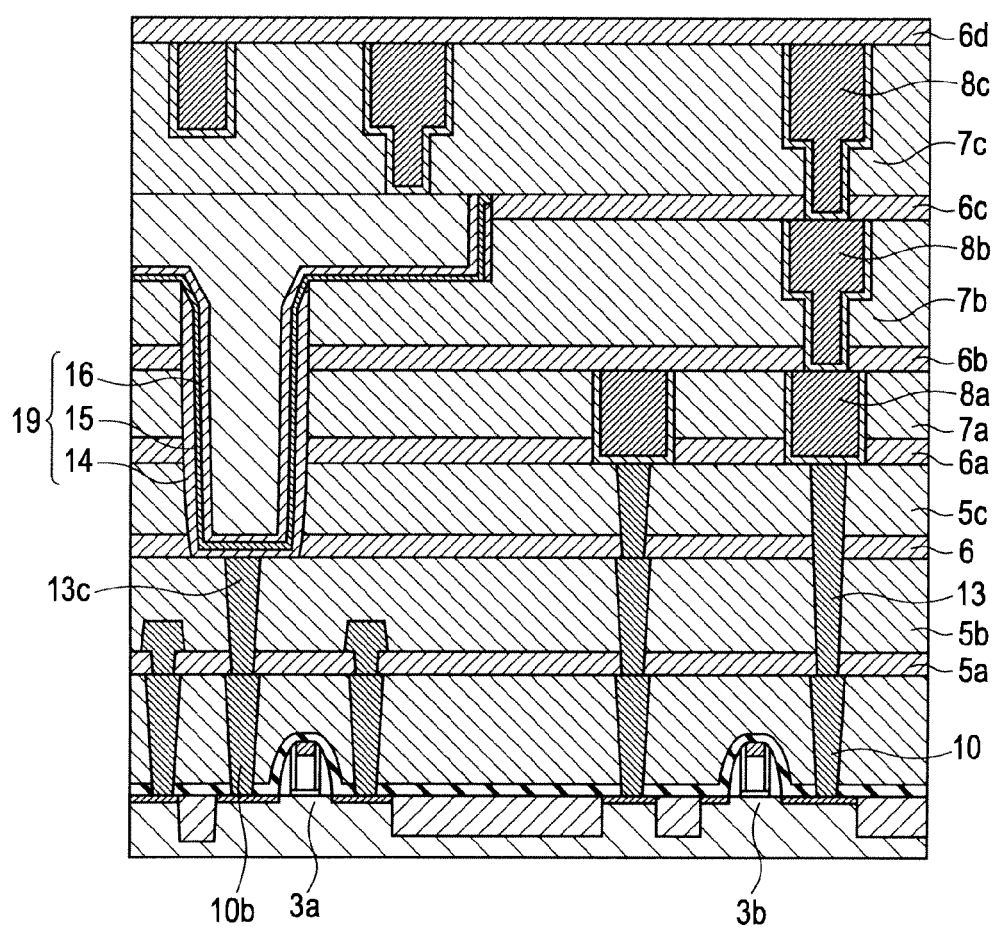
FIG. 26 is a cross-sectional view schematically showing a semiconductor device in a third embodiment.

Subsequently, a semiconductor device of a third embodiment is described using the drawing. FIG. 26 is a cross-sectional view showing the semiconductor device in the third embodiment. The third embodiment is similar to the first embodiment except that height of the coupling contact 13 electrically coupling the active element 3b and the wiring 8a is higher than the height of the capacitor contact 13c coupling the active element 3a and the capacitance element 19. This coupling contact 13 is seamlessly formed from the upper surface to the lower surface thereof.

In the third embodiment, setting the height of the coupling contact 13 high compared with the height of the coupling contact 13b means that for example, the contact interlayer insulating film 5c (the third contact insulating layer) in which only the capacitance element 19 and the contact interlayer insulating film 13 are formed is formed. Consequently, height of the capacitance element 19 can be set high by the height of the coupling contact 13 being higher than the height of the coupling contact 13b. In other words, the height of the capacitance element 19 can be set high by the number of layers or a layer thickness of this contact interlayer insulating film 5c. Consequently, in the third embodiment, the height of the capacitance element 19 is easy to be secured compared with the first embodiment. As a result, electric capacity of the capacitance element 19 can be increased and stabilization of DRAM operation can be realized. The third embodiment can obtain the effect similar to the first embodiment.

Fourth Embodiment

Figure 27:
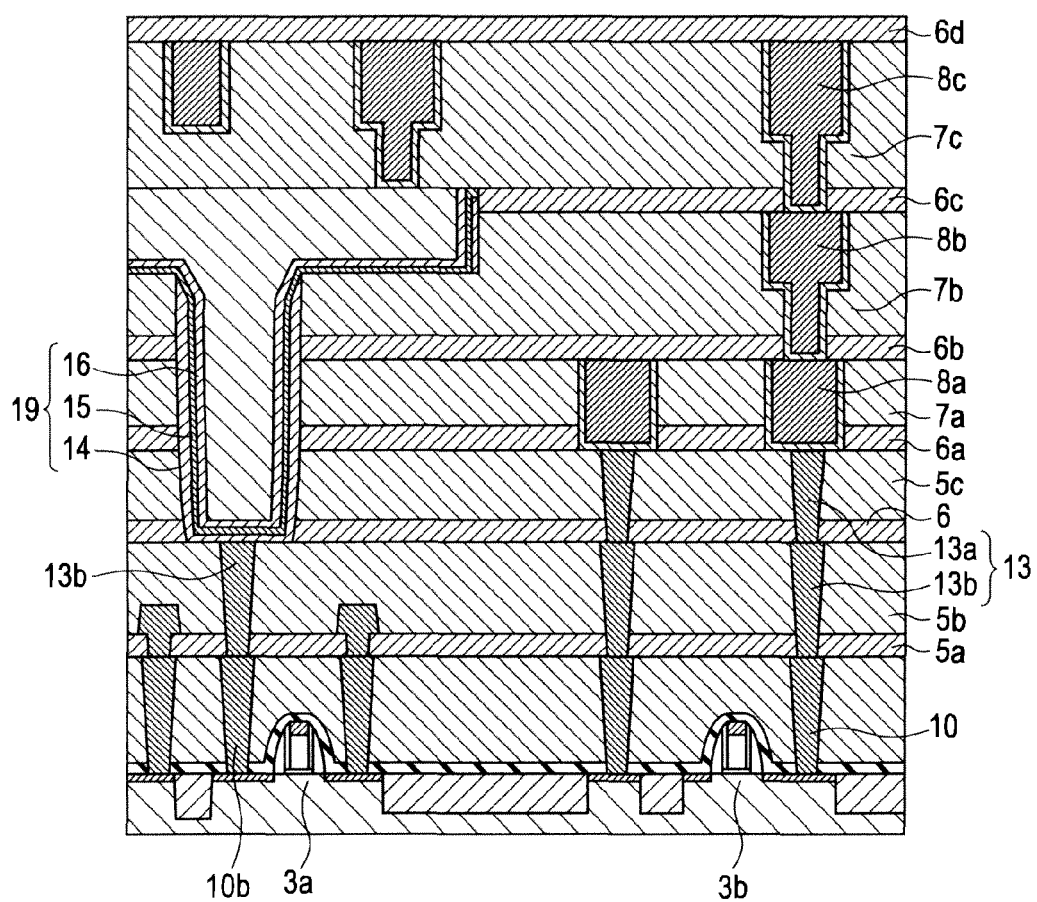
FIG. 27 is a cross-sectional view schematically showing a semiconductor device in a fourth embodiment.

Subsequently, a semiconductor device of a fourth embodiment is described using the drawing. FIG. 27 is a cross-sectional view showing the semiconductor device in the fourth embodiment. The fourth embodiment is similar to the third embodiment except that the coupling contact 13 is configured by two coupling contact 13a and coupling contact 13b.

As shown in FIG. 27, the coupling contact 13b is formed in the same process as the capacitor contact 13c. Subsequently, the coupling contact 13a is formed over the coupling contact 13b. In the contact interlayer insulating film 5c in which this coupling contact 13a is formed, only the capacitance element 19 may be formed except contact. As the contact interlayer insulating film 5c, a silicon dioxide film may be used, and the low dielectric constant film describe above having a lower dielectric constant than the dielectric constant of the silicon dioxide film may be used.

In the fourth embodiment, an aspect ratio can be decreased compared with the third embodiment by separating the coupling contact 13 into multiple contact. As a result, an embedding property of a metal material such as W is improved and the coupling contact 13 can be formed in excellent yield. Consequently, improvement of yield for DRAM elements can be realized in the fourth embodiment compared with the third embodiment.

Fifth Embodiment

Figure 28:
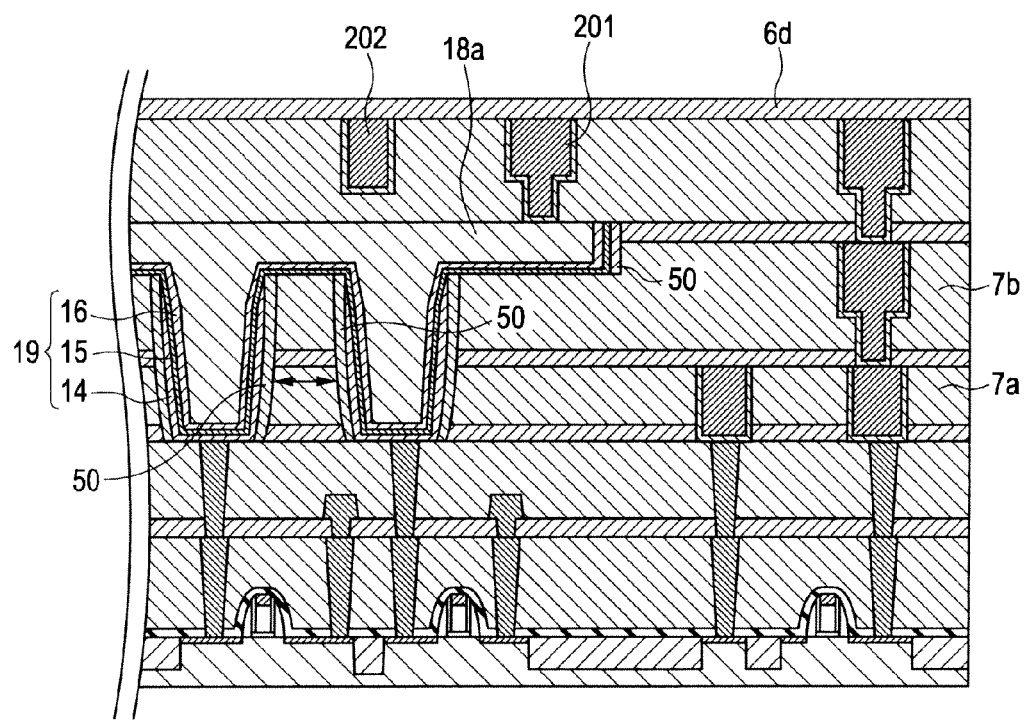
FIG. 28 is a cross-sectional view schematically showing a semiconductor device in a fifth embodiment.

Subsequently, a semiconductor device of a fifth embodiment is described using the drawing. FIG. 28 is a cross-sectional view showing the semiconductor device in the fifth embodiment. In the fifth embodiment, as shown in FIG. 28, a side wall protection film 50 is formed between the lower part electrode 14 and the capacitor insulating film 15 configuring the capacitance element 19, and the interlayer insulating films 7a and 7b. In other words, the side wall protection film 50 is formed so that the lower part electrode 14 dose not contact to the interlayer insulating film 7a and 7b in a region between the adjacent capacitance elements 19. In other words, along whole interlayer insulating film 7a and 7b in which the lower part electrode 14 is located, the side wall protection film 50 seamlessly covers over the side wall of the lower part electrode 14. In a microfabricated semiconductor device in recent years, in order to decrease specific inductive capacity between wirings, what is called a porous film in which fine pores are formed in the interlayer insulating films 7a and 7b may be used. As shown in this embodiment, penetration of the lower part electrode 14 into the interlayer insulating films 7a and 7b in the region between adjacent capacitance elements 19 can be prevented by forming the side wall protection film 50 between adjacent capacitance elements 19. Thereby, the lower part electrode 14 can be stably formed, and effects of decrease in leak current between the capacitance element 19 and the lower part electrode 14 adjacent each other and improvement of reliability in long term insulation are obtained. For the side wall protection film 50 described above, a barrier insulating film including organosilica compounds such as divinysiloxane benzocyclobutene exemplified as a side wall protection film in International Publication No. WO 2004/107434 Pamphlet may be used. Or, a silicon nitride film (SiN), silicon carbide (SiC), silicon carbonitride (SiCN) or silicon oxycarbide (SiOC) may be used for the side wall protection film 50. In this embodiment, the side wall protection film 50 (a deposited layer) can have higher density than the density of the adjacent insulating layer (the interlayer insulating films 7a and 7b). In FIG. 28, a view in which each member of this embodiment is applied to each corresponding member of the first embodiment is shown. However, needless to say, this embodiment can be applicable for other embodiments of the present invention.

Subsequently, a manufacturing method of the semiconductor device of the fifth embodiment is described. In the manufacturing method according to the fifth embodiment, as the manufacturing process of the first embodiment shown in FIG. 16, after forming the concave part 40 (the hole 23 and the wiring groove 28), for example, an insulating film which acts as the side wall protection film 50 having high film density compared with the interlayer insulating films 7a and 7b is deposited over the side wall of the hole 23. The deposited layer described above (the side wall protection film 50) is preferably an insulating film including at least silicon atoms. For example, an insulating film obtained by a chemical vapor deposition method using materials such as a silicon dioxide film ($SiO_2$), silicon carbide (SiC), a silicon nitride film (SiN), silicon carbonitride (SiCN); or an insulating film including silicon, oxygen and carbon, which is generally referred to as a low dielectric constant film; or a film formed by a plasma polymerization method such as a benzocyclobutene film may be used. In other words, in order to obtain the effects according to this embodiment, an insulating film which can close pore parts formed in the side walls of the interlayer insulating films 7a and 7b may be used.

Subsequently, for example, by a method such as reactive ion etching and RF sputtering, at least the side wall protection film 50 at a bottom surface of the opening part 23 is etched back. Thereby, the capacitor contact 13c and a lower part electrode 14 formed later are electrically coupled. This side wall protection film is particularly effective to the case in which a porous insulating film configured from continuous pores are particularly used for the interlayer insulating film. Generally, in the porous insulating film configured from continuous pores, pores are formed by performing ultraviolet ray irradiation and the like to an organic compound existing in the film and having thermal decomposition property at low temperature with heating the substrate to decompose the organic compound to form the pores. The organic compound having thermal decomposition property at low temperature may be mixed by growing the interlayer insulating film using mixture gas of organic compound gas having thermal decomposition property at low temperature and raw material gas for the interlayer insulating film, or by forming chemical bond of the organic compound having thermal decomposition property at low temperature to molecules of the raw material of the interlayer insulating film. At least, an porous insulating film formed by decomposition process of the organic compound by performing ultraviolet irradiation and the like with heating the substrate after growth process of the interlayer insulating film can be used.

Figure 29:
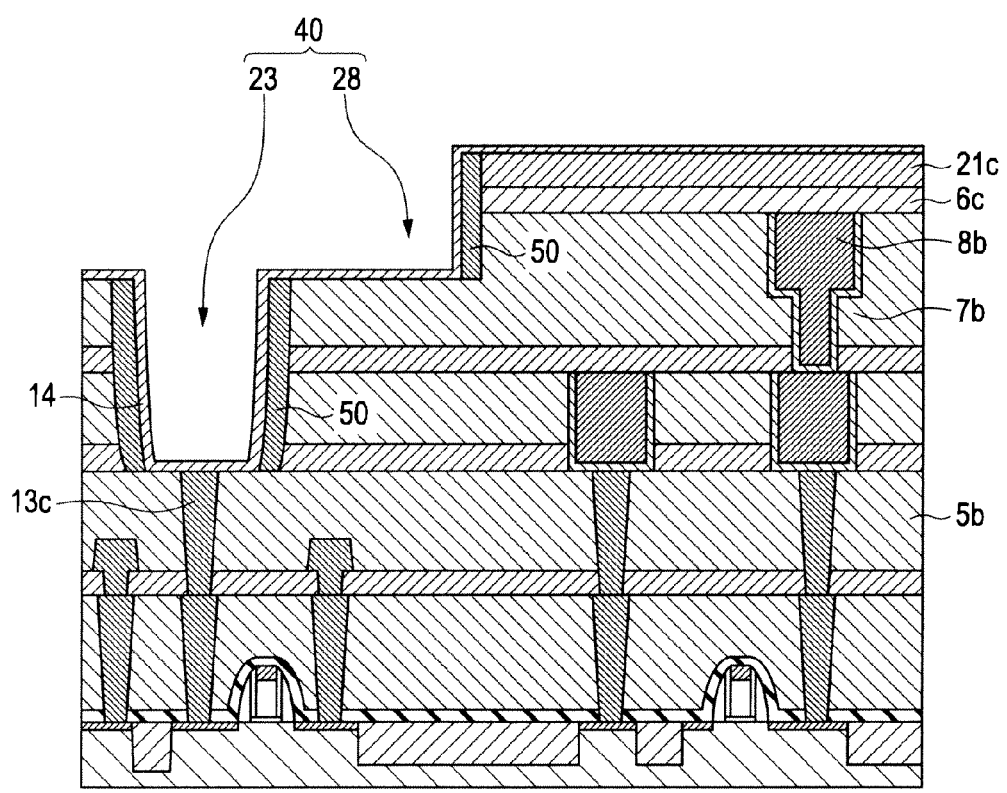
FIG. 29 is a process cross-sectional view showing a manufacturing procedure of the semiconductor device in the fifth embodiment.

Subsequently, as shown in FIG. 29, the lower part electrode 14 is formed over at least the bottom surface of the opening part 23 and the side wall. Since the side wall protection film 50 is formed, for example, even when fine pores formed in the interlayer insulating films 7a and 7b have such shapes as to penetrate from the side wall to inside of the insulating film, penetration of the lower part electrode 14 into the interlayer insulating films 7a and 7b can be prevented.

After forming the lower part electrode 14 by the above-described process, process for forming the capacitance element may be performed in a similar way to the process of FIG. 18 and thereafter.

Sixth Embodiment

Figure 30:
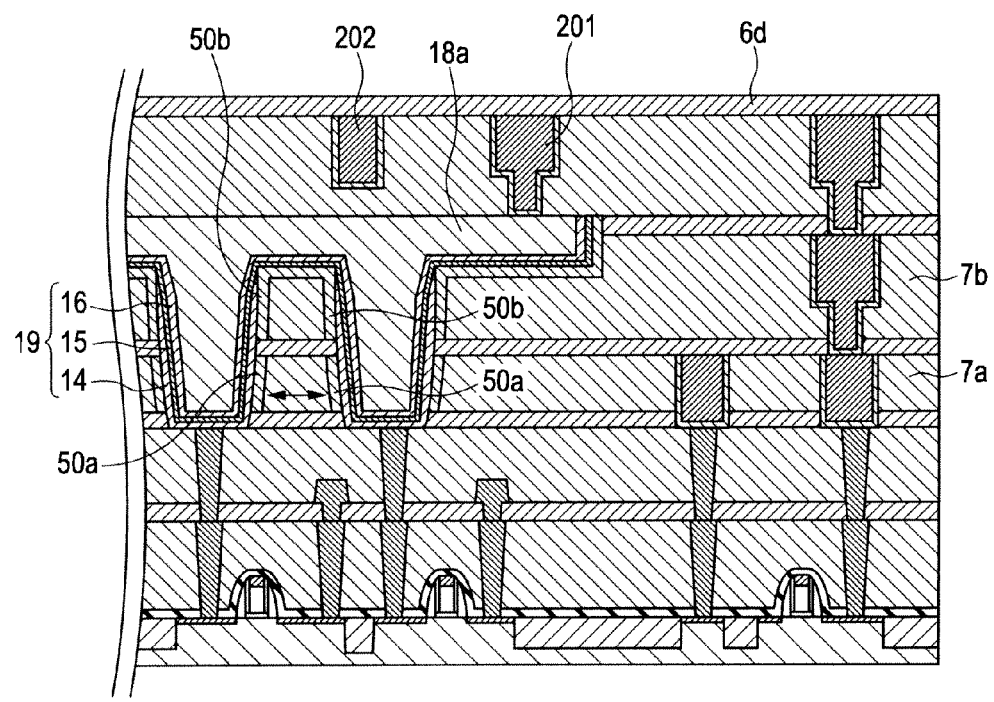
FIG. 30 is a cross-sectional view schematically showing a semiconductor device in a sixth embodiment.

Subsequently, a manufacturing method of a sixth embodiment is described. FIG. 30 is a cross-sectional view showing the sixth embodiment. In the sixth embodiment, as shown in FIG. 30, side wall protection films 50a and 50b are formed between the capacitance element 19 (for example, the lower part electrode 14 and the capacitor insulating film 15 configuring the capacitance element 19) and the lower part wiring interlayer insulating films 7a and 7b. These side wall protection films 50a and 50b are formed only in the region of the interlayer insulating films 7a and 7b. More specifically, the side wall protection films 50a and 50 b and the cap films 6a and 6b are formed over the side wall of the lower part electrode 14 so that the lower part electrode 14 does not contact to the interlayer insulating films 7a and 7b in the region between the adjacent capacitance elements 19. In other words, along whole interlayer insulating films 7a and 7b in which the lower part electrode 14 is located, the side wall protection films 50a and 50b and the cap films 6a and 6b cover over the side wall of the lower part electrode 14. These side wall protection films 50a and 50b include at least one element containing in the interlayer insulating films 7a and 7b, and have high density compared with the interlayer insulating films 7a and 7b.

In a microfabricated semiconductor device in recent years, in order to decrease specific inductive capacity between wirings, what is called a porous film in which fine pores are formed in the interlayer insulating films 7a and 7b may be used. As shown in this embodiment, penetration of the lower part electrode 14 into the interlayer insulating films 7a and 7b in the region between the adjacent capacitance elements 19 can be prevented by forming the side wall protection films 50a and 50b between adjacent capacitance elements 19. Thereby, the lower part electrode 14 can be stably formed, and effects of decrease in leak current between the capacitance element 19 and the lower part electrode 14 adjacent each other and improvement of reliability of long term insulation are obtained.

The side wall protection films 50a and 50b in the sixth embodiment are different from the fifth embodiment described above, and are formed at least at the surface layers of the interlayer insulating films 7a and 7b contacting to the lower part electrode 14. As side wall protection films 50a and 50b described above, for example, as disclosed in International Publication No. WO 2007/132879 Pamphlet, a modified layer in which the surface layers of the interlayer insulating films 7a and 7b is modified, and an mount of carbon is decreased and the number of oxygen atoms are increased per unit deposition compared with inside of the interlayer insulating films 7a and 7b may be formed. In addition, a modified layer modified by hydrogen plasma as disclosed in Japanese Patent Application Publication No. 2009-123886 may be formed. Moreover, as disclosed in International Publication No. WO 03/083935 Pamphlet, a modified layer which includes nitrogen atoms and fluorine atoms may be formed. Since the side wall protection films 50 a and 50b include fluorine atoms, conductivity of the lower part electrode 14 is impaired when a compound is formed with the lower part electrode 14 formed later. However, according to this embodiment, the fluorine atoms the side wall protection films 50a and 50b contain, have strong bonds to nitrogen atoms. Therefore, the lower part electrode 14 and the side wall protection films 50a and 50b do not form the compound. As a result, a problem in which conductivity of the lower part electrode 14 is lost does not occur. In FIG. 30, a view in which each member of this embodiment is applied to each corresponding member of the first embodiment is shown. However, needless to say, this embodiment can be applicable to other embodiments of the present invention.

Subsequently, a manufacturing method of the semiconductor device of the sixth embodiment is described. In the manufacturing method according to the sixth embodiment, as the manufacturing process of the first embodiment shown in FIG. 16, modified layers which act as the side wall protection films 50a and 50b are formed after forming the hole 23 and the wiring groove 28. These modified layers are formed by modifying the surface layers of the interlayer insulating films 7a and 7b. In other words, in an atmosphere of hydrogen, nitrogen, carbon or fluorine or in an atmosphere in which inert gas such as helium and argon is added to these gases, the side wall protection films 50a and 50b are formed by modifying the surface layer of the interlayer insulating films 7a and 7b by excitation of plasma. Or, by performing exposure treatment to ultraviolet radiation in an atmosphere which include at least oxygen, the surface layers of the interlayer insulating films 7a and 7b are modified and the side wall protection films 50a and 50b are formed.

Figure 31:
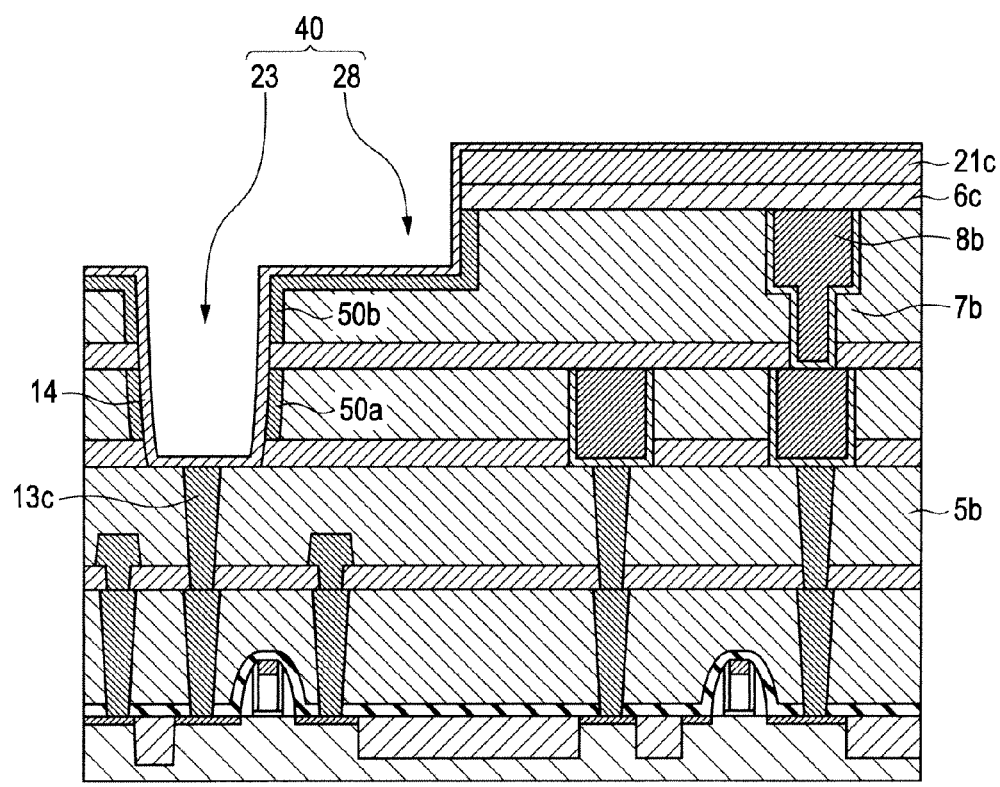
FIG. 31 is a process cross-sectional view showing a manufacturing procedure of the semiconductor device in the sixth embodiment.

Subsequently, as shown in FIG. 31, the lower part electrode 14 is formed. Since the side wall protection films 50a and 50b are formed, for example, even when fine pores formed in the interlayer insulating films 7a and 7b have such shapes as to penetrate from the side wall to inside of the insulating film, penetration of the lower part electrode 14 into the interlayer insulating films 7a and 7b can be prevented. After forming the lower part electrode 14 by the above-described process, process for forming the capacitance element may be performed in a similar way to the process of FIG. 18 and thereafter.

Here, terms used in these embodiments are described. The semiconductor substrate is a substrate over which the semiconductor device is configured. A substrate simply formed over the single crystal silicon substrate. Not only that, but also a substrate such as an SOI (Silicon On Insulator) substrate and a TFT (Thin Film Transistor) and a substrate for manufacturing liquid crystal is included.

The hard mask is an insulating film which is stacked over the interlayer insulating film and protects it when it is difficult to directly perform plasma etching and CMP due to decrease in mechanical strength and decrease in a process resistance property caused by reduction in a dielectric constant of the interlayer insulating film. The plasma CVD method is a method, for example, for forming a continuous film over the substrate by vapor phase reaction or reaction over the substrate surface which is conducted by continuously supplying raw material gas to a reaction chamber under reduced pressure and exiting the molecules by plasma energy.

The PVD method is a method including a highly oriented sputtering method such as a long throw sputtering method, a collimated sputtering method and an ionized sputtering method which intends to improve an embedding property, to improve film quality and to form uniform film thickness within a wafer surface, other than a common sputtering method. When an alloy is spattered, a formed metal film can be an alloy film by previously containing a metal except main components in a metal target whose content is equal to or lower than solid solubility limit. In the present invention, the alloy film can be used for a Cu seed layer mainly when a damascene Cu wiring is formed or when a barrier metal is formed.

Of course, the above described embodiments and multiple modifications can be used in combination within a range in which their contents are not conflicting. In addition, structures of each part and the like are specifically described in the above-described embodiments and the modifications. However, the structures and the like can be variously modified in a range in which they can satisfy the present invention.

What is claimed is:

1. A semiconductor device comprising:
   a substrate;
   a multilayer wiring layer which is located over the substrate and in which a plurality of wiring layers configured by a wiring and an insulating layer are stacked;
   a memory circuit which is formed in a memory circuit region in the substrate and has at least one capacitance element and a peripheral circuit embedded in a concave part located in the multilayer wiring layer in a plan view;
   a logic circuit which is formed in a logic circuit region in the substrate being a different region from the memory circuit region in a plan view;
   an upper part coupling wiring which is stacked over the capacitance element configured by a lower part electrode, a capacitor insulating film and an upper part electrode in the concave part, wherein the concave part is configured by a hole in which the capacitance element is embedded, and a wiring groove which is continuously located outside of the hole and in which the upper part coupling wiring is embedded, the upper part coupling wiring contacting the upper electrode part both in the wiring groove and in a lower region of the hole; and
   a cap layer which is located so as to contact to an upper surface of the wiring configuring the logic circuit located in a top layer among the wiring layers in which the capacitance element is embedded;
   wherein an upper surface of the upper part coupling wiring and an upper surface of the cap layer configure the same plane.

2. The semiconductor device according to claim 1,
   wherein the lower surface of the wiring groove and the lower surface of the cap layer configure the same plane.

3. The semiconductor device according to claim 1, further comprising:
   a first active element formed in the memory circuit region over the substrate;
   a second active element formed in the logic circuit region over the substrate;
   a capacitor contact electrically coupling the first active element and the capacitance element; and
   a coupling contact electrically coupling the second active element and the wiring of the logic circuit.

4. The semiconductor device according to claim 3, wherein the coupling contact is seamlessly configured from an upper surface to a lower surface thereof.

5. The semiconductor device according to claim 3, wherein the coupling contact comprises a first coupling contact and a second coupling contact which electrically couples the first coupling contact and the wiring and is different from the first coupling contact.

6. The semiconductor device according to claim 3, wherein the capacitor contact is configured by a material comprising W.

7. The semiconductor device according to claim 3, further comprising:
   a first contact insulating layer which is located over the substrate and in which a first cell contact and a second cell contact are embedded; and
   a second contact insulating layer which is located over the first contact insulating layer and in which the capacitor contact and the coupling contact are embedded;
   wherein the first contact insulating layer or the second contact insulating layer has a low dielectric constant compared with a dielectric constant of a silicon dioxide film.

8. The semiconductor device according to claim 7, further comprising:
- a bit line located in the second contact insulating layer in which the capacitor contact is located;
- wherein the bit line is configured by a material comprising W.

9. The semiconductor device according to claim 3, further comprising:
- a third contact insulating layer having only the capacitance element and the coupling contact between over the substrate and the lower surface of the wiring configuring the logic circuit.

10. The semiconductor device according to claim 1, wherein a side wall protection film is formed between the insulating layer and the lower part electrode.

* * * * *